United States Patent [19]
Shoen

[11] Patent Number: 5,991,522
[45] Date of Patent: Nov. 23, 1999

[54] METHOD AND APPARATUS FOR CIRCUIT CONVERSION FOR SIMULATION, SIMULATOR USING THE SAME, AND COMPUTER-READABLE MEDIUM WITH A PROGRAM THEREFOR STORED THEREON

[75] Inventor: Akihisa Shoen, Yokohama, Japan

[73] Assignee: Fujitsu Limited, Kawasaki, Japan

[21] Appl. No.: 08/917,272

[22] Filed: Aug. 25, 1997

[30] Foreign Application Priority Data

Mar. 14, 1997 [JP] Japan .................................. 9-061235

[51] Int. Cl.[6] .................................................. G06F 17/50
[52] U.S. Cl. ........................................ 395/500.05; 364/578
[58] Field of Search ................................... 364/578, 488, 364/489, 490, 491

[56] References Cited

U.S. PATENT DOCUMENTS

| | | | |
|---|---|---|---|
| 5,095,454 | 3/1992 | Huang | 364/578 |
| 5,111,413 | 5/1992 | Lazansky et al. | 364/578 |
| 5,297,066 | 3/1994 | Mayes | 364/578 |
| 5,394,346 | 2/1995 | Milsom | 364/578 |
| 5,467,291 | 11/1995 | Fan et al. | 364/578 |
| 5,623,418 | 4/1997 | Rostoker et al. | 364/489 |
| 5,677,856 | 10/1997 | Tani | 364/578 |
| 5,719,783 | 2/1998 | Karzman et al. | 364/488 |
| 5,757,679 | 5/1998 | Sawai et al. | 364/578 |
| 5,828,586 | 10/1998 | Yokota | 364/578 |

OTHER PUBLICATIONS

Overhauser et al., "Evaluating Mixed Signal Simulators" 1995 IEEE, pp. 113–120, 1995.

Hussain et al., Automatic Dynamic Mixed Mode Simulation through Network Reconfiguration, 1995 IEEE, pp. 582–584, 1995.

Becque, Behavioural Mixed A/D System Exploration, 1994 IEEE, pp. 2.1–2.5, 1994.

Chaung et al., Analogue Behavioural modelling and Simulation Using VHDL and Saber–Mast, 1994 IEEE, pp. 1/1–1/5, 1994.

Tahawy et al., "VHDeLDO: A New Mixed Mode Simulation", 1993 IEEE, pp. 546–551.

Wang et al., "Design and Test of Mixed Signal VLSI", 1993 IEEE, pp. 461–464.

Fernandez et al., "ASAP: A Portable Program for the Symbolic Analysis of Analog Integrated Circuits" 1990 IEEE, pp. 80–85.

Acuna et al., "Simulation Techniques for Mixed Analog/Digital Circuits", 1990 IEEE, pp. 353–363.

*Primary Examiner*—Kevin J. Teska
*Assistant Examiner*—Lonnie A. Knox
*Attorney, Agent, or Firm*—Staas & Halsey, LLP

[57] ABSTRACT

Circuit data for a digital/analog hybrid circuit is classified as those for types of data such as a net, a circuit symbol, a symbol pin, and an outside terminal. A conversion rule for each type of classified circuit data is specified by a conversion rule collator. Classified circuit data is converted by a circuit model builder according to the specified conversion rule to convert the digital/analog hybrid circuit to a circuit suited for digital simulation.

23 Claims, 44 Drawing Sheets

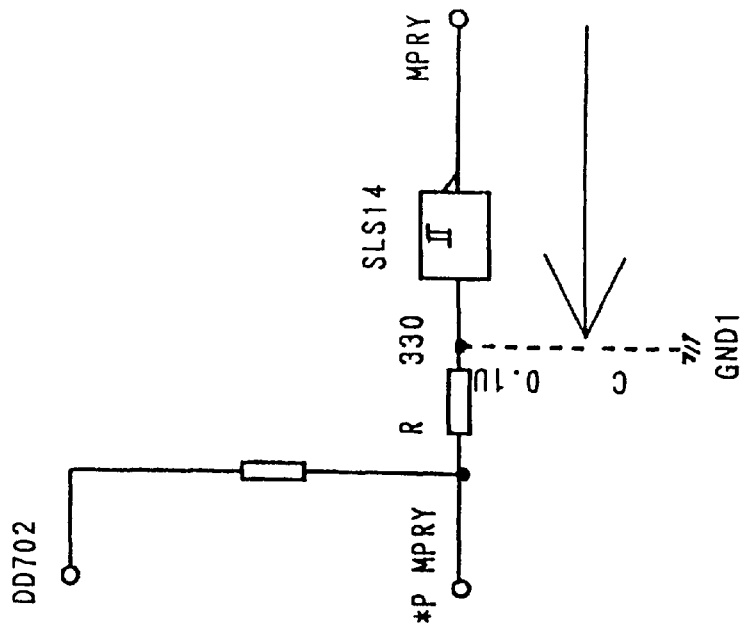
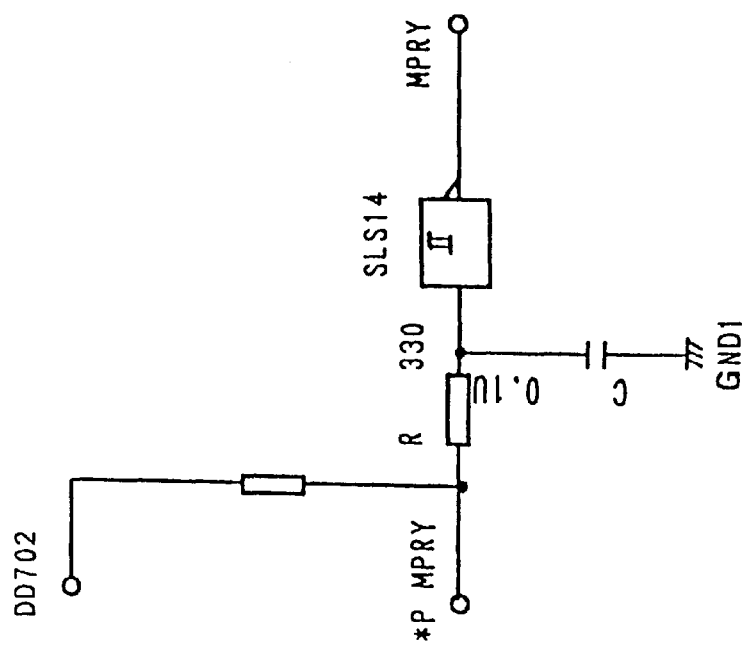
FIG. 21
MODELLING PROCESS

FIG. 23
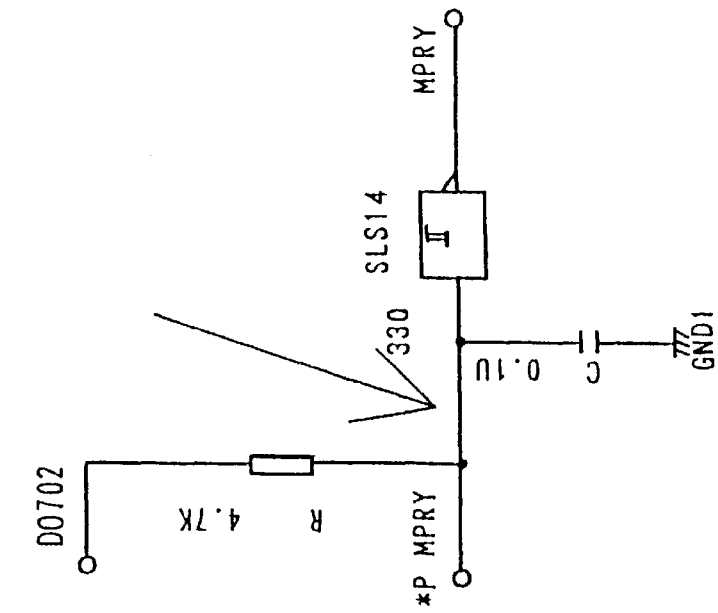
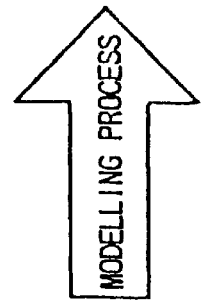
MODELLING PROCESS
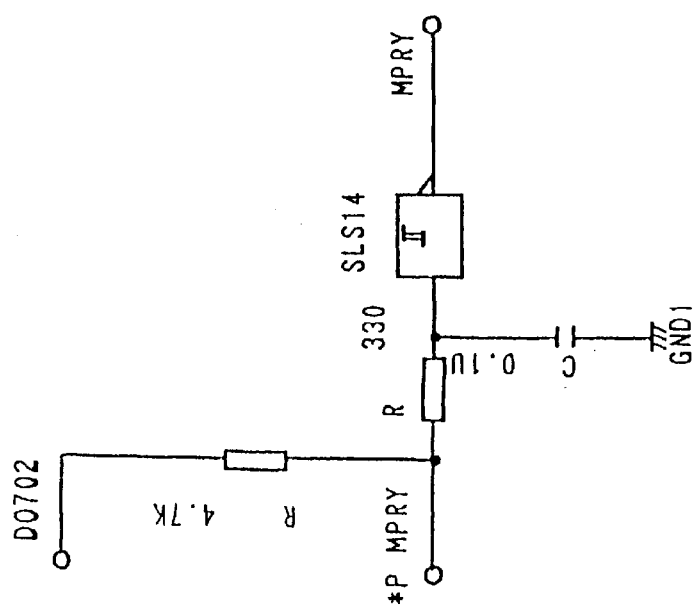

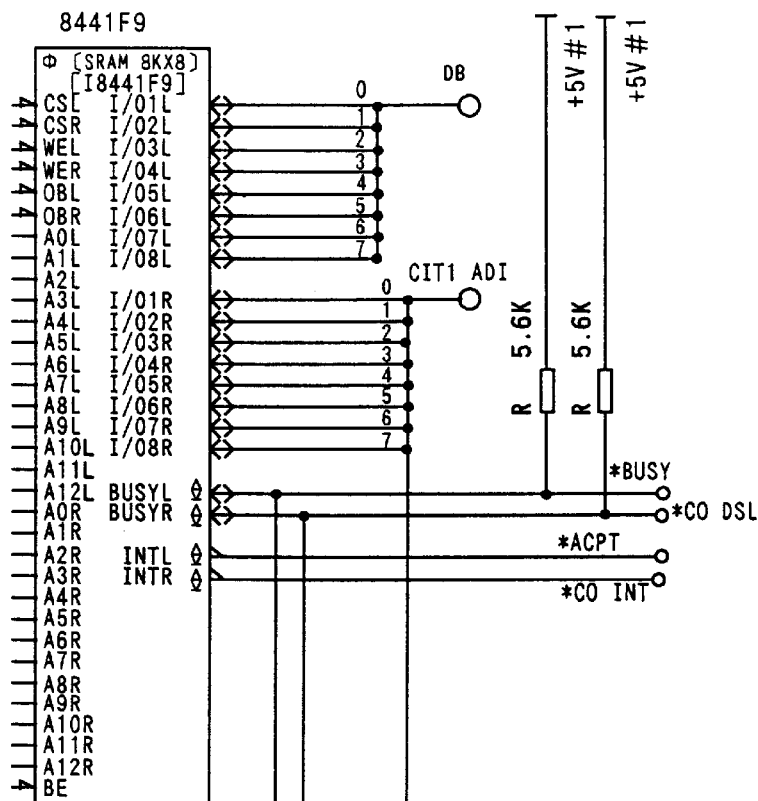
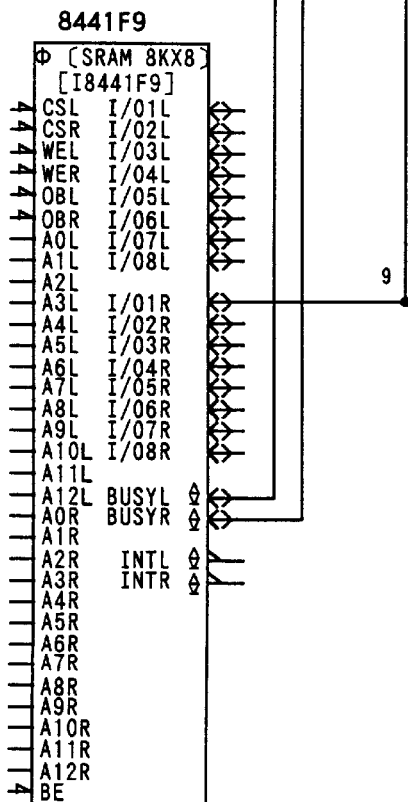
FIG.29

DIGITAL CIRCUIT PORTION

ANALOG CIRCUIT PORTION

DUMMY CIRCUIT

METHOD AND APPARATUS FOR CIRCUIT CONVERSION FOR SIMULATION, SIMULATOR USING THE SAME, AND COMPUTER-READABLE MEDIUM WITH A PROGRAM THEREFOR STORED THEREON

FIELD OF THE INVENTION

The present invention relates to a method and an apparatus for circuit conversion for simulation, a simulator using the same, and a computer-readable medium with a program therefor readable by a computer recorded thereon, and more particularly to a method and an apparatus for circuit conversion for simulation for converting a large-scale digital/analog hybrid circuit to a circuit for digital simulation for efficient high-speed simulation, a simulator using the same, and a computer-readable medium with a program therefor readable by a computer recorded thereon.

BACKGROUND OF THE INVENTION

In association with the progress in the field of LSI toward larger scale and more sophisticated functions, the demands for a digital/analog hybrid circuit, in which a digital circuit and an analog circuit coexist in one piece of LSI, have been increasing. When simulating the digital/analog hybrid circuit as described above with a logic simulator, it is necessary to rewrite the digital/analog hybrid circuit to a circuit corresponding to characteristics of the logic simulator used for that purpose. Namely, it is necessary to rewrite the digital/analog hybrid circuit to a circuit for digital simulation in a case of a digital simulator, and to a circuit for analog simulation in a case of an analog simulator respectively.

FIG. 48 shows a digital/analog hybrid circuit (refer to Japanese Patent Laid-Open Publication No. HEI 4-71072) comprising a feedback loop for fetching an analog signal at a signal level in response to a 2-bit digital input value consisting of the output from an AND circuit 41 and that from a flip-flop (FF) 42 from a D/A converter (DAC) 43, inputting the analog signal via a circuit section comprising a resistor 44, an amplifier 44, resistors 46, 47, and a capacitor 48 to an A/D converter (ADC) 49, fetching a 2-bit digital output corresponding to an input signal level from the A/D converter (ADC) 49, outputting one bit thereof via an inverter 50 to the outside, and loading the other one bit thereof into the flip-flop (FF) 42.

In a case where the digital/analog hybrid circuit, in which a digital circuit portion and an analog circuit portion coexist as shown in FIG. 48, is simulated as it is with a digital simulator, the analog circuit portion comprising the D/A converter (DAC) 43, resistors 44, 46, 47, amplifier 45, capacitor 48, and A/D converter (ADC) 49 becomes a load to the simulation, and it becomes difficult to accurately simulate all functions within a short period of time. As a result, execution of high-speed simulation is impeded. This phenomenon is caused because the analog circuit portion comprises exponential information, which is different from simple binary information and is not suited to the processing for simulation. In other words, the reason is that bidirectionality of an analog element can not precisely be treated by the digital simulator.

As a result, if, for instance, data concerning a digital/analog hybrid circuit is inputted into a digital simulator, the analog circuit portion can not be verified and may be outputted as an error, which makes it difficult to execute high-speed simulation accurately. Especially, in a large-scale digital/analog hybrid circuit, the impedance as described above becomes considerable.

It should be noted that, also in a case where a logic gate circuit is subjected to circuit simulation at an analog transistor level with an analog simulator, efficiency is extremely low and the entire circuit can not be efficiently simulated.

For the reasons described above, conventionally high-speed simulation for a digital circuit portion and an analog circuit portion is efficiently realized by simulating the digital circuit portion with a dedicated digital simulator and also simulating the analog circuit portion with a dedicated analog simulator, respectively.

In a case of simulation with a digital simulator, it is necessary to rewrite a digital/analog hybrid circuit to a circuit for digital simulation.

For instance, in a case of the digital/analog hybrid circuit shown in FIG. 48, the digital circuit portion comprising the AND circuit 41, flip-flop (FF) 42, and inverter 20 must be rewritten to the circuit for digital simulation as shown in FIG. 49. Concretely, as shown in the figure, rewriting work is carried out to describe the D/A converter (DAC) 43 with a dummy circuit consisting of the AND circuits 51 and 52 and also to describe the A/D converter (ADC) 49 with a dummy circuit consisting of inverters 53 and 56.

It should be noted that the analog circuit portion comprising the D/C converter (DAC) 43, resistors 44, 46, 47, amplifier 45, capacitor 48, and A/D converter (ADC) 49 is rewritten to the circuit for analog simulation as shown in FIG. 50. Practically, however, the amplifier 45 is described with a circuit comprising transistors and resistors.

Also conventionally, in a case where a digital/analog hybrid circuit is simulated with a digital simulator as described above, all the work for rewriting the digital/analog hybrid circuit to a circuit for digital simulation has been carried out manually. In conventional technology, a scale of a digital/analog hybrid circuit itself is not so large, so that the work required for rewriting a digital/analog circuit to a circuit for digital simulation can be fully carried out manually, and in addition, the product development cycle is not so short. For this reason, the work can easily be carried out manually within a period of time allowance for a plurality of simulations until a required circuit is fixed.

In the conventional technology, in a case where a digital/analog hybrid circuit is simulated with a digital simulator, the digital/analog hybrid circuit is written to a circuit corresponding to characteristics of a logic simulator to be used completely through manual work, so that a large number of steps are required each time circuit conversion is to be executed.

The work for circuit conversion becomes more complicated as scale of a digital/analog hybrid circuitry becomes larger, and in manual work, such mistakes as transcription mistakes easily occur.

Further, at present, product development cycle is extremely short, while an extremely long period of time is required for circuit conversion work by executed simulation processing several times until a required circuit is fixed, if all the necessary work is executed manually.

SUMMARY OF THE INVENTION

An advantage of the present invention is in a method and an apparatus for circuit conversion for simulation in which the performance of simulation processing can be realized to its greatest extent by automatically executing operations for rewriting a digital/analog hybrid circuit that has become increasingly large. This is carried out by means of a novel circuit conversion technology to model a digital/analog hybrid circuit to a circuit corresponding to characteristics of the simulation. Another advantage is in providing a simulator using the method and apparatus and a machine-readable recording medium with a program therefor recorded thereon.

In the novel circuit conversion method for simulation according to the present invention, inputted circuit data for a digital/analog hybrid circuit is classified to data for an analog circuit portion and those for a digital circuit portion, and the classified data for the analog circuit portion is converted to a circuit suited for digital simulation according to a conversion rule.

In the circuit conversion method for simulation according to the present invention, at first, in the circuit data classifying step, inputted circuit data for a digital/analog hybrid circuit are classified according to types of circuit attributes such as a net, a circuit symbol, a symbol pin, and an external terminal. Then, in the conversion rule collating step, a conversion rule corresponding to each type of classified circuit data is specified for each classified circuit data by collating the conversion rule to a circuit conversion rule table. The classified circuit data then is converted according to the conversion rule specified in the conversion rule collating step in the circuit model building step to convert the digital/analog hybrid circuit to a circuit suited for digital simulation.

In the circuit conversion method for simulation according to the present invention, a resistance circuit comprising an input pin for digital circuit symbols and based on connection to a power source net or a ground net is modelled as a digital constant value ("1" or "0") according to a conversion rule stored in the circuit conversion rule table.

In the circuit conversion method for simulation according to the present invention, according to a conversion rule stored in a circuit conversion rule table, an analog symbol for a resistor, a by-pass capacitor for a power source, a transistor, a diode, a crystal oscillator, a speaker, a switch, and an analog circuit such as an operating amplifier, a delay circuit, and a filter circuit are deleted; a through gate or a delay control gate is inserted into the deleted portion, or nets at both edges of the deleted portion are opened for modelling to a digital circuit.

In the circuit conversion method for simulation according to the present invention, an analog symbol for a resistor based on open collector dot connection is replaced with an AND logic gate according to a conversion rule stored in the circuit conversion rule table.

In the circuit conversion method for simulation according to the present invention, a power circuit and a ground net are deleted for conversion to a digital model according to a conversion rule stored in the circuit conversion rule table.

In the circuit conversion method for simulation according to the present invention, signal input/output attributes for digital circuit symbols and signal input/output attributes for an outside terminal are optimized according to the modelled circuit.

In the circuit conversion method for simulation according to the present invention, in a case where signal flow in the modelled circuit is interrupted, an outside terminal is generated according to a conversion rule stored in the circuit conversion rule table to enable transaction of signals from the outside.

In the circuit conversion method for simulation according to the present invention, an outside terminal digitally not required and a circuit functionally floating in the modelling process are automatically deleted according to a conversion rule stored in the circuit conversion rule table.

In the circuit conversion method for simulation according to the present invention, an outside terminal is connected to a specified place by instructing external connections in circuit conversion to enable controls in simulation.

In the circuit conversion method for simulation according to the present invention, modelling such as deletion or setting of a constant can arbitrally be executed for each symbol by discretely specifying a unique name for each symbol in circuit data.

In the simulator according to the present invention, simulation is executed for circuit data having been subjected to model conversion using each of the circuit conversion methods for simulation described above.

In the circuit converting apparatus according to the present invention, inputted circuit data for a digital/analog hybrid circuit is classified to data for an analog circuit portion and those for a digital circuit portion, and the classified analog circuit portion is converted to a circuit suited to digital simulation according to a conversion rule.

In the circuit converting apparatus according to the present invention, a circuit data classifying means classifies circuit data for a digital/analog hybrid circuit to those for types of circuit attributes such as a net, a circuit symbol, a symbol pin, and an outside terminal. A conversion rule collating means specifies for each classified circuit data a conversion rule corresponding to each type of circuit data classified by the circuit data classifying means by collating a conversion rule to the circuit conversion rule table. A circuit model building means converts the circuit data classified by the circuit data classifying means according to the conversion rule specified by the conversion rule collating means to convert a digital/analog hybrid circuit to a circuit suited to digital simulation.

In the simulator according to the present invention, simulation is executed to the circuit data having been subjected to model conversion using each of the circuit converting apparatuses described above.

In the computer-readable medium having stored thereon a program according to the present invention, first inputted circuit data for a digital/analog hybrid data is classified according to types of circuit attributes such as a net, a circuit symbol, a symbol pin, or an external pin in a circuit data classification sequence. A conversion rule corresponding to each type of classified circuit data is then specified for each classified circuit data by collating the conversion rule to the circuit conversion rule table in a conversion rule collation sequence. The classified circuit data is converted according to the conversion rule specified in the conversion rule collation sequence in a circuit model building sequence to convert the digital/analog hybrid circuit to a circuit suited for digital simulation.

In the computer-readable medium having stored thereon a program according to the present invention, a resistance circuit comprising an input pin for digital circuit symbols and based on connection to a power source net or a ground net is modelled as a digital constant value ("1" or "0") according to a conversion rule stored in the circuit conversion rule table.

In the computer-readable medium having stored thereon a program according to the present invention, an analog symbol for a resistor, a by-pass capacitor, a transistor, a diode, a crystal oscillator, a speaker, a switch, an analog circuit such as an operating amplifier, a delay circuit, and a filter circuit are deleted. A through gate or a delay control gate is inserted into the deleted portion or nets both edges of the deleted portion are opened according to a conversion rule stored in the circuit conversion rule table for modelling to a digital circuit.

In a computer-readable medium having stored thereon a program according to the present invention, an analog symbol for a resistor based on open collector dot connection is replaced with an AND logic gate according to a conversion rule stored in the circuit conversion rule table.

In a computer-readable medium having stored thereon a program according to the present invention, a power circuit and a ground net are deleted for conversion to a digital model according to a conversion rule stored in the circuit conversion rule table.

In a computer-readable medium having stored thereon a program according to the present invention, signal input/output attributes for digital circuit symbols and signal input/output attributes for an outside terminal are optimized for the modelled circuit according to a conversion rule stored in the circuit conversion rule table.

In a computer-readable medium having thereon a program according to the present invention, in a case where signal flow is interrupted in the modelled circuit, an outside terminal is generated for enabling a transaction of signals from the outside according to a conversion rule stored in the circuit conversion rule table.

In a computer-readable medium according to the present invention, an outside terminal digitally not required and a circuit functionally floating in the modelling process are automatically deleted according to a conversion rule stored in the circuit conversion rule table.

In a computer-readable medium having stored thereon a program according to the present invention, an outside terminal is connected to a specified place by instructing external connection in circuit conversion for enabling controls in simulation.

In a computer-readable medium having stored thereon a program according to the present invention, modelling such as deletion or setting of a constant can be arbitrarily be executed for each symbol by unique symbol names in circuit data.

Other objects and features of this invention will become understood from the following description with reference to the accompanying drawings.

BRIEF DESCRIPTION OF THE DRAWINGS

FIG. 21 is a circuit diagram showing a concrete example of conversion according to the conversion rule (3) used in the method and apparatus for circuit conversion for simulation according to the present invention;

FIG. 23 is a circuit diagram showing a concrete example of conversion according to the conversion rule (5) used in the method and apparatus for circuit conversion for simulation according to the present invention;

FIG. 29 is a circuit diagram showing a concrete example before the data is converted to the model according to the conversion rule (9) used in the method and apparatus for circuit conversion for simulation according to the present invention;

DESCRIPTION OF THE PREFERRED EMBODIMENTS

Detailed description is made hereinafter for preferred embodiments of the method and apparatus for circuit conversion for simulation, a simulator using the same, and a computer-readable medium having stored thereon a program therefor according to the present invention with reference to the attached drawings.

Figure 1:
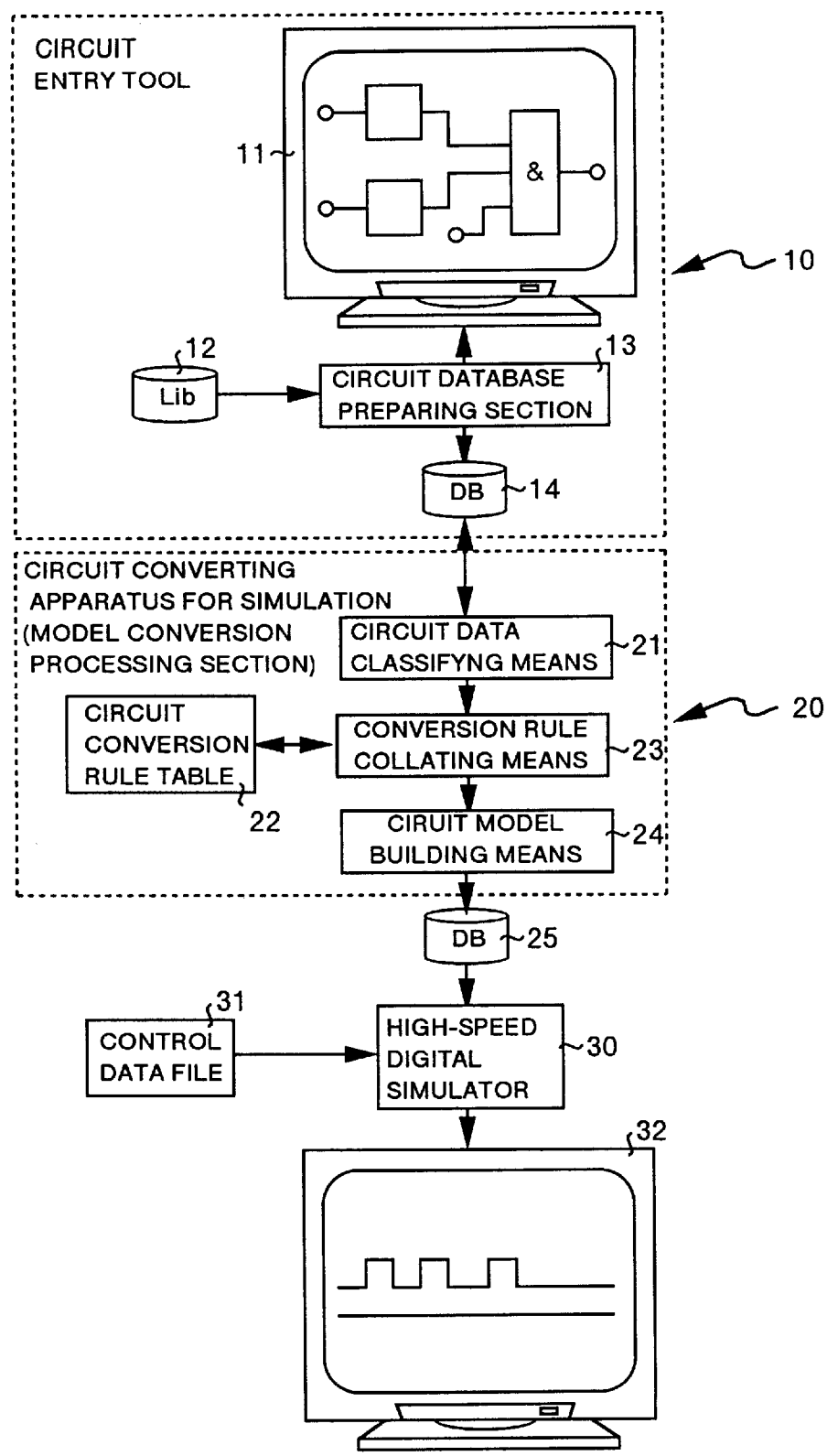
FIG. 1 is a block diagram showing one embodiment of an EDA (Electronic Design Automation) system including a circuit converting apparatus for simulation according to the present invention.

FIG. 1 shows one embodiment of an EDA (Electronic Design Automation) system including a circuit converting apparatus for simulation for a digital/analog hybrid circuit according to the present invention. The EDA system comprises a circuit entry tool 10, a circuit converting apparatus for simulation (a model converting section) 20, and a high-speed digital simulator 30.

The circuit entry tool 10 is an ordinary circuit-designing tool in an interactive system and prepares a digital/analog hybrid electric circuit on the screen of a display 11 in the interactive system using a symbol library 12, and stores data for the digital/analog hybrid circuit described in VHDL (VHSIC (Very High Speed IC) Hardware Description Language) or the like in a circuit database 14 by preparing a circuit database by a circuit database preparing section 13.

The circuit converting apparatus for simulation (model converting section) 20 comprises a circuit data classifying means 21, a circuit conversion rule table 22, a conversion rule collating means 23, and a circuit model building means 24.

The circuit data classifying means 21 executes a circuit data classifying step and classifies inputted circuit data for a digital/analog hybrid circuit according to the circuit database 14 in the circuit entry tool 10 to various types of data each corresponding to a type of circuit attribute such as a net, a circuit symbol, a symbol pin, and an outside terminal or the like.

Figure 2:
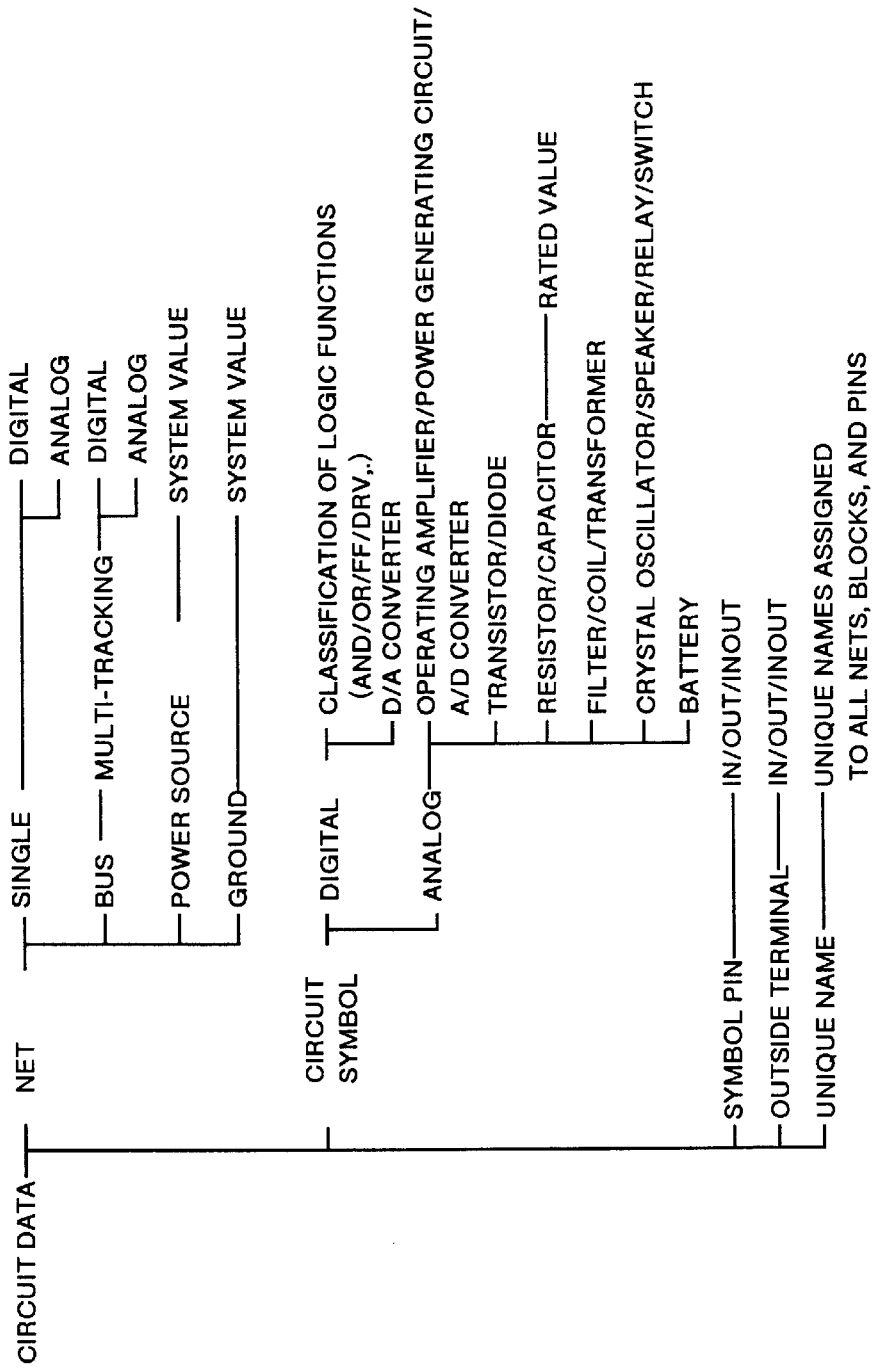
FIG. 2 is an explanatory view showing one example of a data classified structure used in the method and apparatus for circuit conversion for simulation according to the present invention.

FIG. 2 shows an example of structure of data classification executed by the circuit data classifying means 21. In this data classified structure, the circuit data (circuit connection data) in the circuit database 14 is largely classified into data for nets, circuit symbols, symbol pins, and outside terminals. Of the data, net information is subdivided into data for analog, digital, a power source, and a ground or the like. The circuit symbol information is subdivided into data for digital and analog, and the digital circuit symbols are further subdivided for each logical function (AND/OR/FF or the like). The analog symbols are subdivided for each analog function (a transistor, a diode, resistance, a capacitor or the like). And the symbol pins and outside terminals are stored therein as pin information.

Each unique name allocated to all the nets, circuit symbols (blocks) and pins is also stored in the circuit database 14.

The circuit conversion rule table 22 stores therein conversion rules each set for each of the types of circuit data classified by the circuit data classifying means 21. These conversion rules define, as shown in Table 1 described below, the contents of instruction for conversion of a resistor, a capacitor, a coil, a filter, a net, an outside terminal, and an analog component or the like by specifying a destination for connection and a rated value (in cases of a resistor and a capacitor or the like) according to the data classification structure described above.

TABLE 1

| Type of Circuit Classification | Symbol Code | Destination for Connection | Rated Value | Contents of Instruction for Processing |
|---|---|---|---|---|
| Resistor | R | Power source-Input pin | 120 kΩ | Setting of logic "1" |
| | | Signal-Ground | 101–1 kΩ | Setting of logic "0" |
| | | Power source-Input pin | 1K–10 kΩ | Deleted |
| | | Signal-Ground | 10 kΩ or more | Deleted |
| | | Signal-Signal | 0–100 Ω | Delay control gate |
| Capacitor | C | Power source-Ground | 0.22 UF, 1000 P | Deleted |
| Coil, Filter | FLxx | Signal-Signal-Ground | — | Delay control gate |
| Delay | DLxx | Analog section | — | Deleted |
| | | Digital section | — | Delay control gate |
| Net | Power source | Power source symbol | +3.3 V#n | Deleted |
| | Ground | Ground symbol | GND #n | Deleted |
| | Analog signal | — | — | Deleted |
| Outside terminal Symbol pin | EXT1, EXT2 — | — | — | IN/OUT/INOUT Setting of attribute |
| Analog symbol | Transistor Diode Crystal Speaker Relay Operating amplifier | — | — | All deleted |
| Discrete instruction | All | — | — | "1"/"0" IN/OUT/INOUT |

Next, a description is made for examples of conversion rules (1) to (16) with reference to FIG. 3 to FIG. 15. It should be noted that, in a case where there are reference codes A and B in each figure, A indicates a digital/analog hybrid circuit before circuit model conversion, and B indicates a digital model (described in VHDL) after circuit model conversion respectively.

Figure 3:
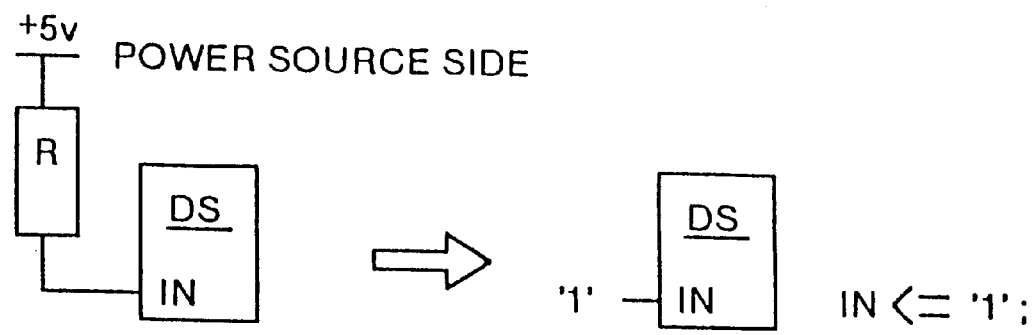
FIG. 3 is a circuit diagram showing an example of conversion according to a conversion rule (1) used in the method and apparatus for circuit conversion for simulation according to the present invention.

(1) In a case where a resistor R (pull-up resistor) is connected to an electrode net as well as to an input pin of a digital circuit symbol DS, the resistor R is deleted and a logic value (digital constant value) "1" or "0" is digitally set in the input pin IN thereof (Refer to FIG. 3).

Figure 4:
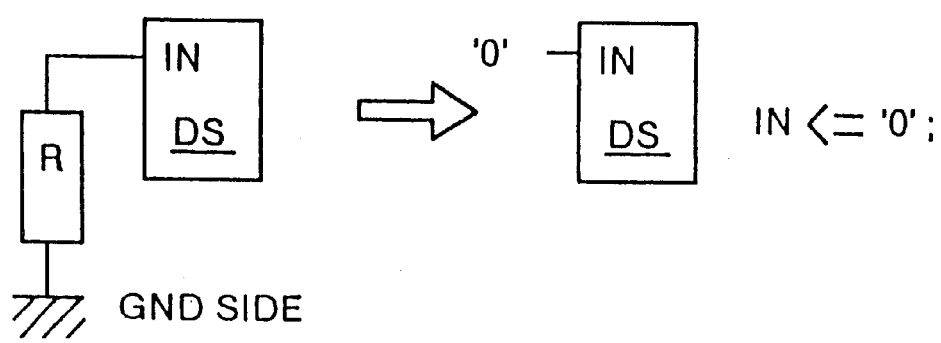
FIG. 4 is a circuit diagram showing an example of conversion according to a conversion rule (2) used in the method and apparatus for circuit conversion for simulation according to the present invention.

(2) In a case where a resistor R (pull-up resistor) is connected to a ground net as well as to the input pin of the digital circuit symbol DS, the resistor R is deleted and the logic value (digital constant value) "0" or "1" is digitally set in the input pin IN thereof (Refer to FIG. 4).

Figure 5:
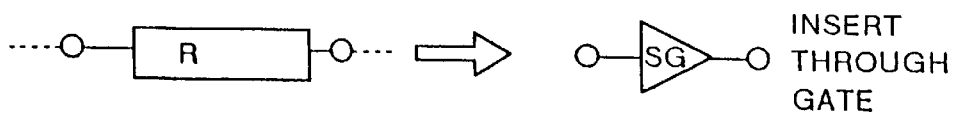
FIG. 5 is a circuit diagram showing an example of conversion according to a conversion rule (3) used in the method and apparatus for circuit conversion for simulation according to the present invention.

(3) In a case of a resistor R with a low resistance value, a through gate SG is inserted into the portion as described above, assuming that the digital model has no resistance (Refer to FIG. 5).

Figure 6:
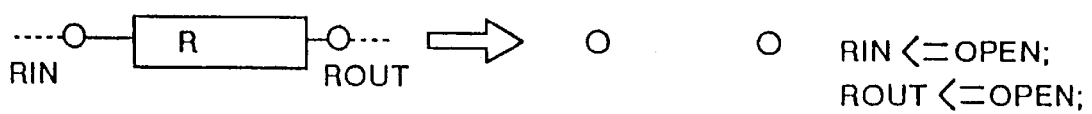
FIG. 6 is a circuit diagram showing an example of conversion according to a conversion rule (4) used in the method and apparatus for circuit conversion for simulation according to the present invention.

(4) In a case of a resistor R with a high resistance value, the resistor is deleted in a digital model and nets at both edges of the portion are opened (Refer to FIG. 6).

Figure 7:
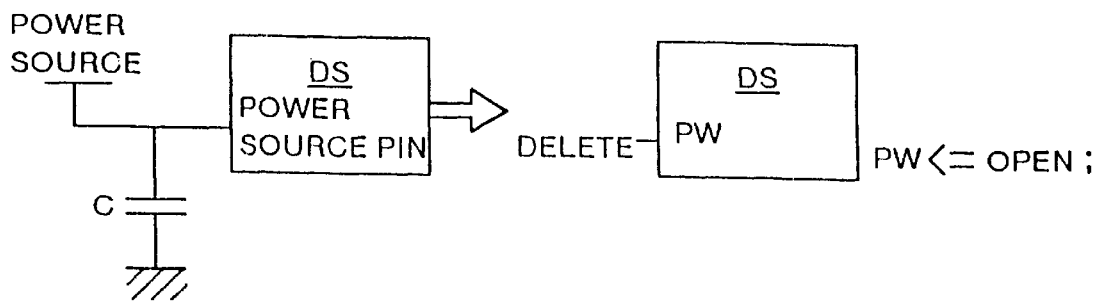
FIG. 7 is a circuit diagram showing an example of conversion according to a conversion rule (5) used in the method and apparatus for circuit conversion for simulation according to the present invention.

(5) In a case where a capacitor C is connected to a section between the power source and the ground, namely the capacitor is a by-pass capacitor for the power source, it is not required in a digital model, so that the capacitor C is deleted and nets at both edges of the portion are opened (Refer to FIG. 7).

Figure 8:
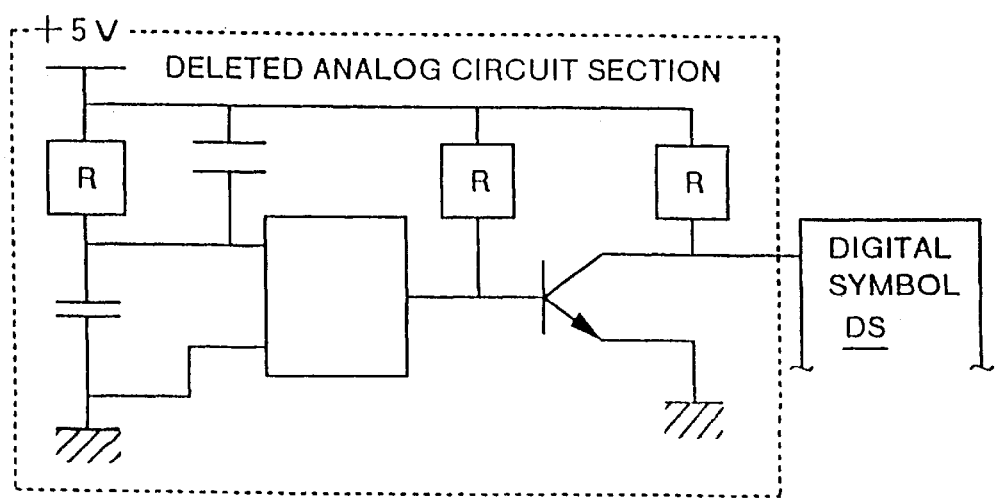
FIG. 8 is a circuit diagrams showing an example of conversion according to a conversion rule (6) used in the method and apparatus for circuit conversion for simulation according to the present invention.

(6) A transistor, a diode, a crystal oscillator, a speaker, a relay, a switch, and an analog symbol such as an operating amplifier or the like and an analog circuit section comprising the components are not required in a digital model, so that the analog symbols and analog circuit section are deleted and nets at both edges of the portion are opened (Refer to FIG. 8).

Figure 9:
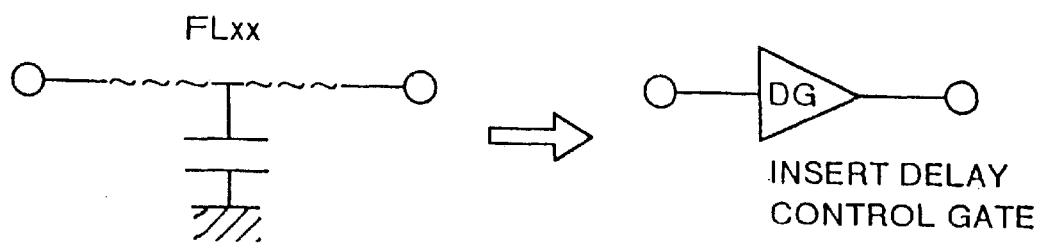
FIG. 9 is a circuit diagram showing an example of conversion according to a conversion rule (7) used in the method and apparatus for circuit conversion for simulation according to the present invention.

(7) A filter such as "FLxx" is not required in a digital model, so that the filter symbol is deleted and a delay control gate DG is inserted into the portion (Refer to FIG. 9).

Figure 10:
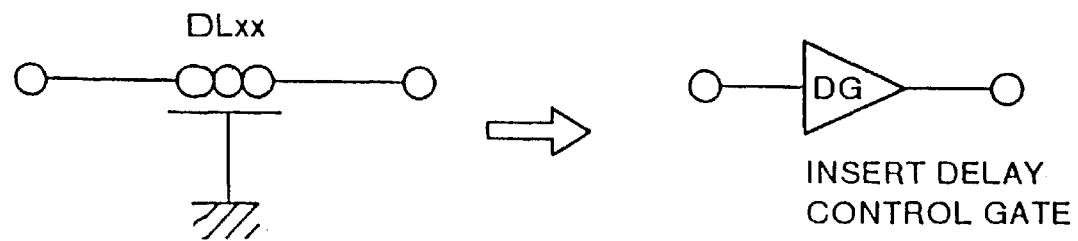
FIG. 10 is a circuit diagram showing an example of conversion according to a conversion rule (8) used in the method and apparatus for circuit conversion for simulation according to the present invention.

(8) A delay circuit is deleted in a case where symbols provided before and after the delay circuit such as "DLxx" are analog symbols, and in a case where the symbols are digital circuit symbols, a delay control gate DG is inserted in the portion (Refer to FIG. 10).

Figure 11:
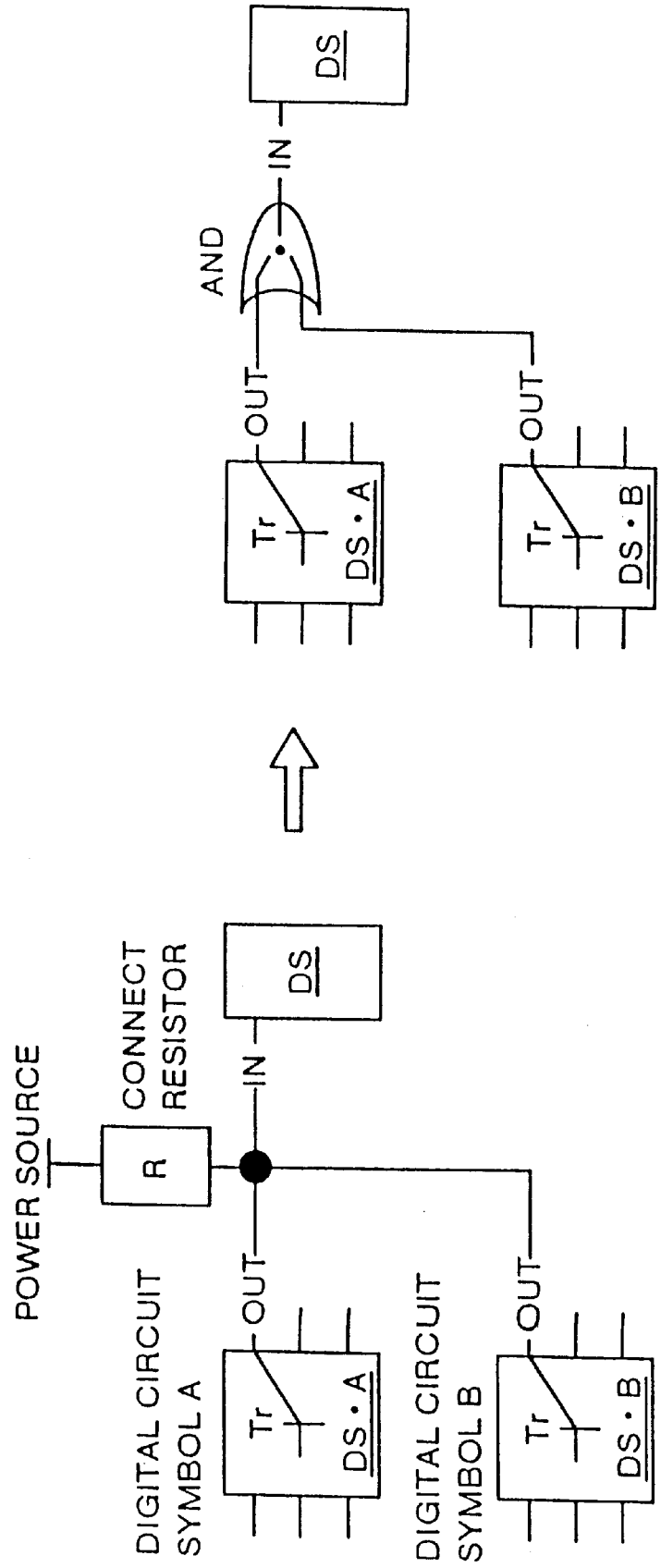
FIG. 11 is a circuit diagram showing an example of conversion according to a conversion rule (9) used in the method and apparatus for circuit conversion for simulation according to the present invention.

(9) As for a place where a resistor R is connected based on open collector dot connection with digital circuit symbols DS•A and DS•B, the resistor R is deleted, and is replaced with an AND logic circuit (Refer to FIG. 11)

(10) A power source net is searched from power source symbols and a power circuit is deleted.

(11) A ground net is searched from ground symbols and the ground net is deleted.

Figure 12:
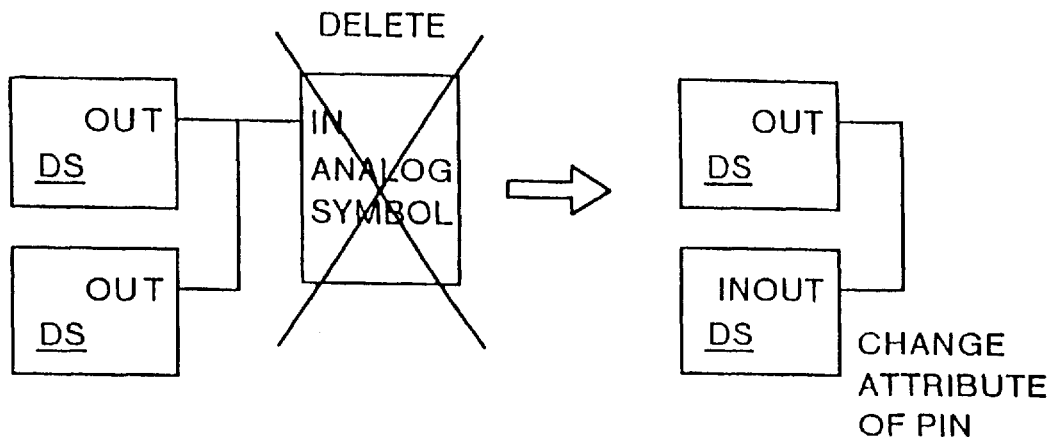
FIG. 12 is a circuit diagram showing an example of conversion according to a conversion rule (12) used in the method and apparatus for circuit conversion for simulation according to the present invention.

(12) In a case where contradiction occurs between signal input/output attributes (IN/OUT attributes) for digital circuit symbols DS due to a modelled circuit, the attribute of the symbol pin is optimized (Refer to FIG. 12).

Figure 13:
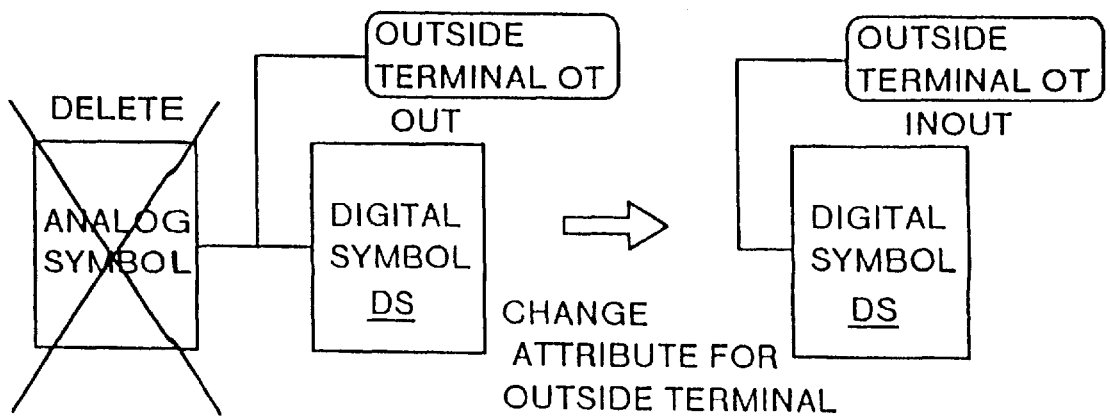
FIG. 13 is a circuit diagram showing an example of conversion according to a conversion rule (13) used in the method and apparatus for circuit conversion for simulation according to the present invention.

(13) In a case where an attribute of an outside terminal OT and that for the symbol pin are identical to each other due to deletion of a circuit connected to the outside terminal in association with circuit conversion, the attribute for the outside terminal OT is changed to that for Input/Output (INOUT) (Refer to FIG. 13).

Figure 14:
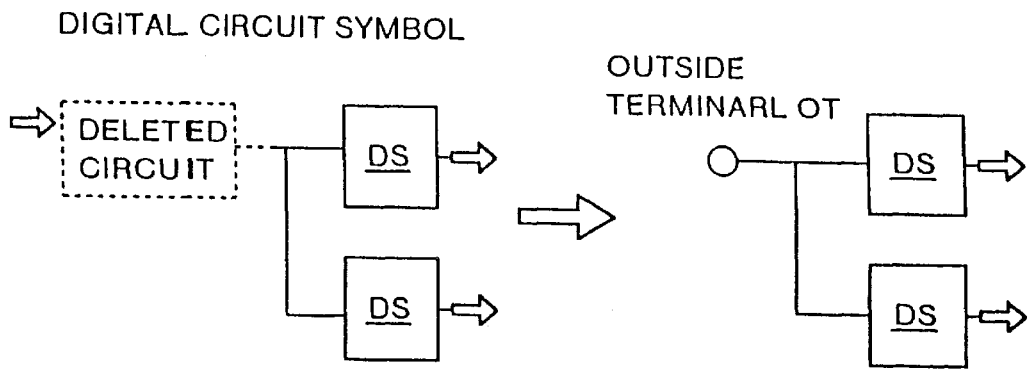
FIG. 14 is a circuit diagram showing an example of conversion according to a conversion rule (14) used in the method and apparatus for circuit conversion for simulation according to the present invention.

(14) In a case where combination of a driver and a receiver with digital circuit symbols DS is not established in a modelled circuit and a signal flow is interrupted therein, an outside terminal OT is generated to enable transaction of control signals from the outside (Refer to FIG. 14).

Figure 15:
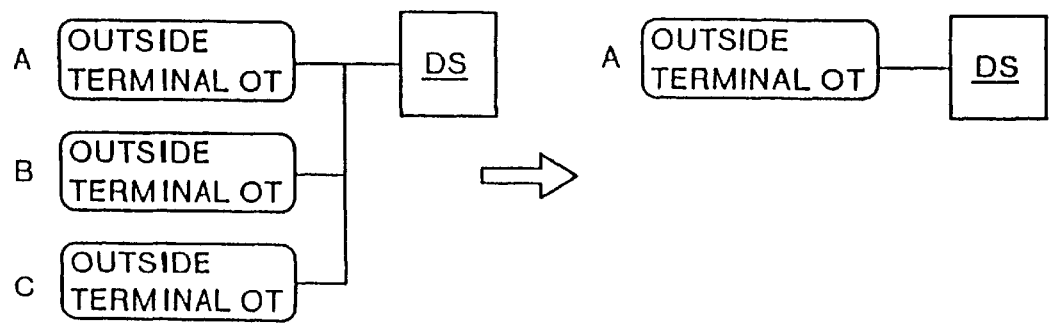
FIG. 15 is a circuit diagram showing an example of conversion according to a conversion rule (15) used in the method and apparatus for circuit conversion for simulation according to the present invention.
Figure 16:
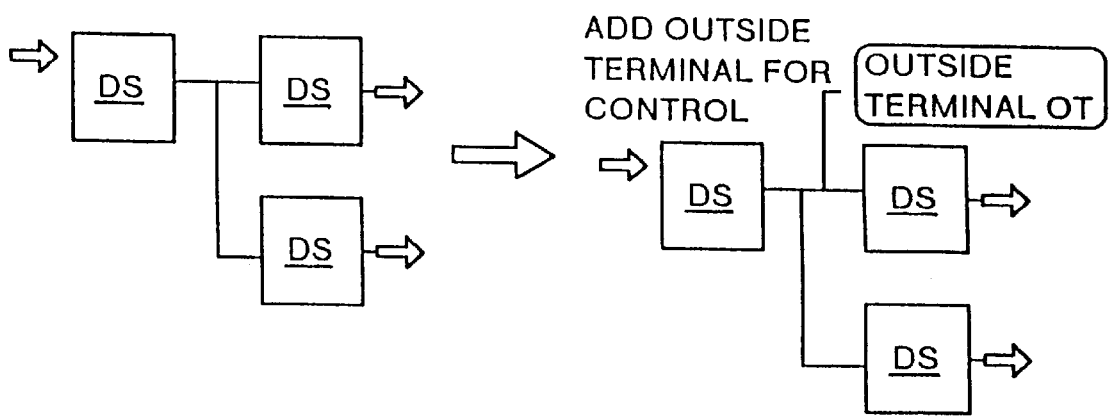
FIG. 16 is a circuit diagram showing an example of addition of an outside terminal to the circuit in the method and apparatus for circuit conversion for simulation according to the present invention.

(15) A plurality of outside terminals OT provided for securing features as an analog signal are not digitally required and deleted (Refer to FIG. 15).

(16) A completely floating circuit not having any connection with input and output of signals is deleted in the modelling process.

The conversion rules in the circuit conversion rule table 22 can be changed and some more rules can be added thereto by the user side. With this operation, the rules can instantly respond to particular conditions specific to each user, and for this reason design flexibility thereof is improved.

The conversion rule collating means 23 executes a conversion rule collating step and specifies conversion rules each corresponding to a type of circuit data classified by the circuit data classifying means 21 for each classified circuit data according to collation of conversion rules with each other by the circuit conversion rule table 22.

The circuit model building means 24 executes a circuit model building step and converts the circuit data classified by the circuit data classifying means 21 according to any of the conversion rules (1) to (16) specified by the conversion rule collating means 23, converts data for a digital/analog hybrid circuit inputted through the circuit entry tool 10 to a circuit model suited for digital simulation, and stores the circuit data converted to the digital circuit model in the circuit database 25.

The circuit model building means 24 adds, as shown in 16, in a case where a state value of a particular terminal is controlled from the outside, an outside terminal OT to a specified place and control in the simulation can be executed from the outside by specifying an instruction for extending a symbol pin in a digital circuit according to the classified structure to the outside terminal OT. Also, in a completely different case from those as described above, a unique name for each symbol is discretely specified to execute modelling such as deletion or constant value setting.

The high-speed digital simulator 30 is an ordinary simulator executing logical collation for reading control data in a control data file 31 as well as the circuit data (circuit data converted to the digital circuit model) stored in the circuit database 25, and displays a result of simulation on a display 32.

Next, a description is made for a particular example in which the circuit model building means 24 converts data for a classified circuit to a circuit model suited for digital simulation according to any of the conversion rules (1) to (16) with reference to FIG. 17 to FIG. 43. It should be noted that, in the figures, each section indicated by the arrow is a converted section after the conversion of the data to the model.

Figure 17:
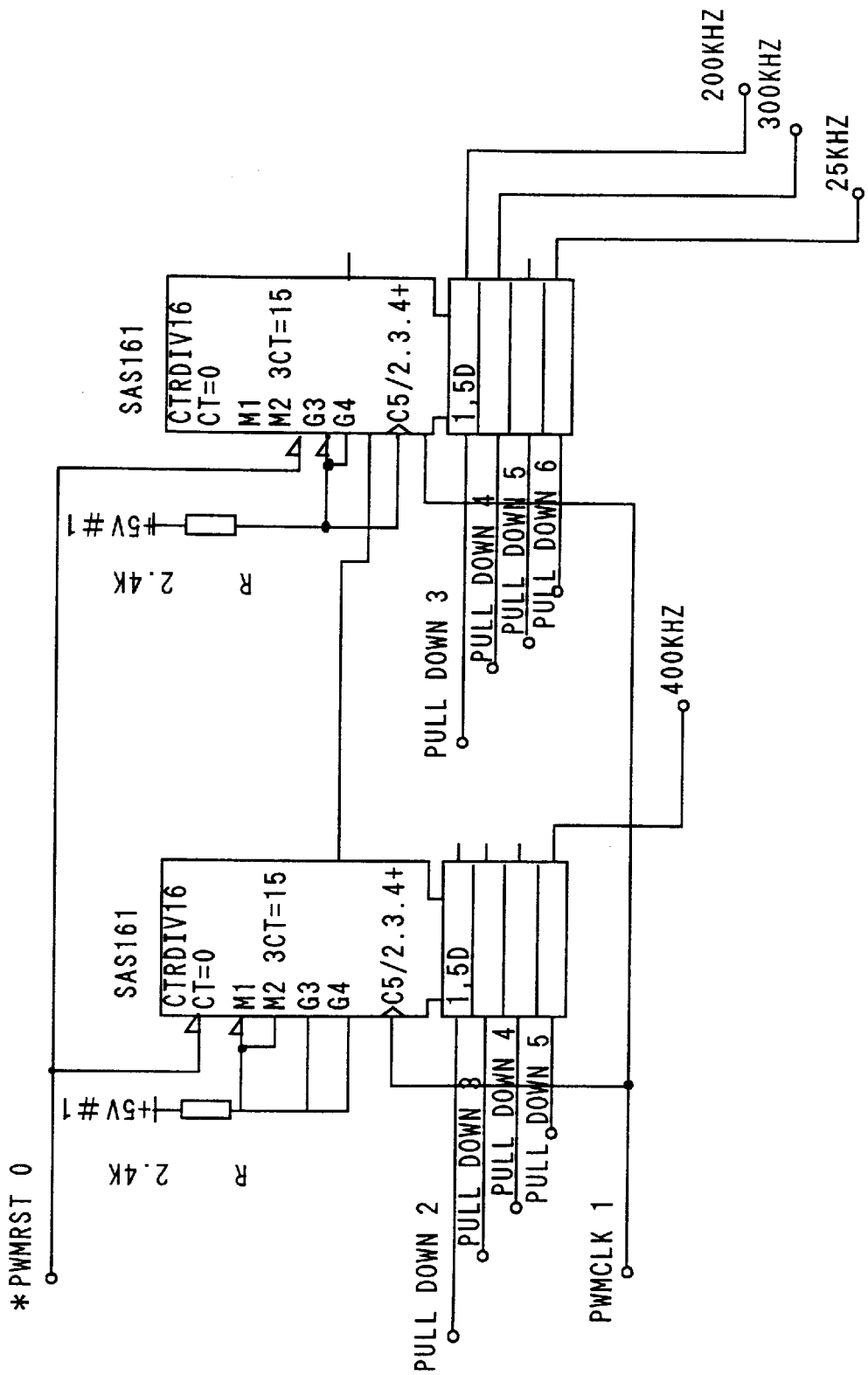
FIG. 17 is a circuit diagram showing a concrete example before the data is converted to the model according to the conversion rule (1) used in the method and apparatus for circuit conversion for simulation according to the present invention.
Figure 18:
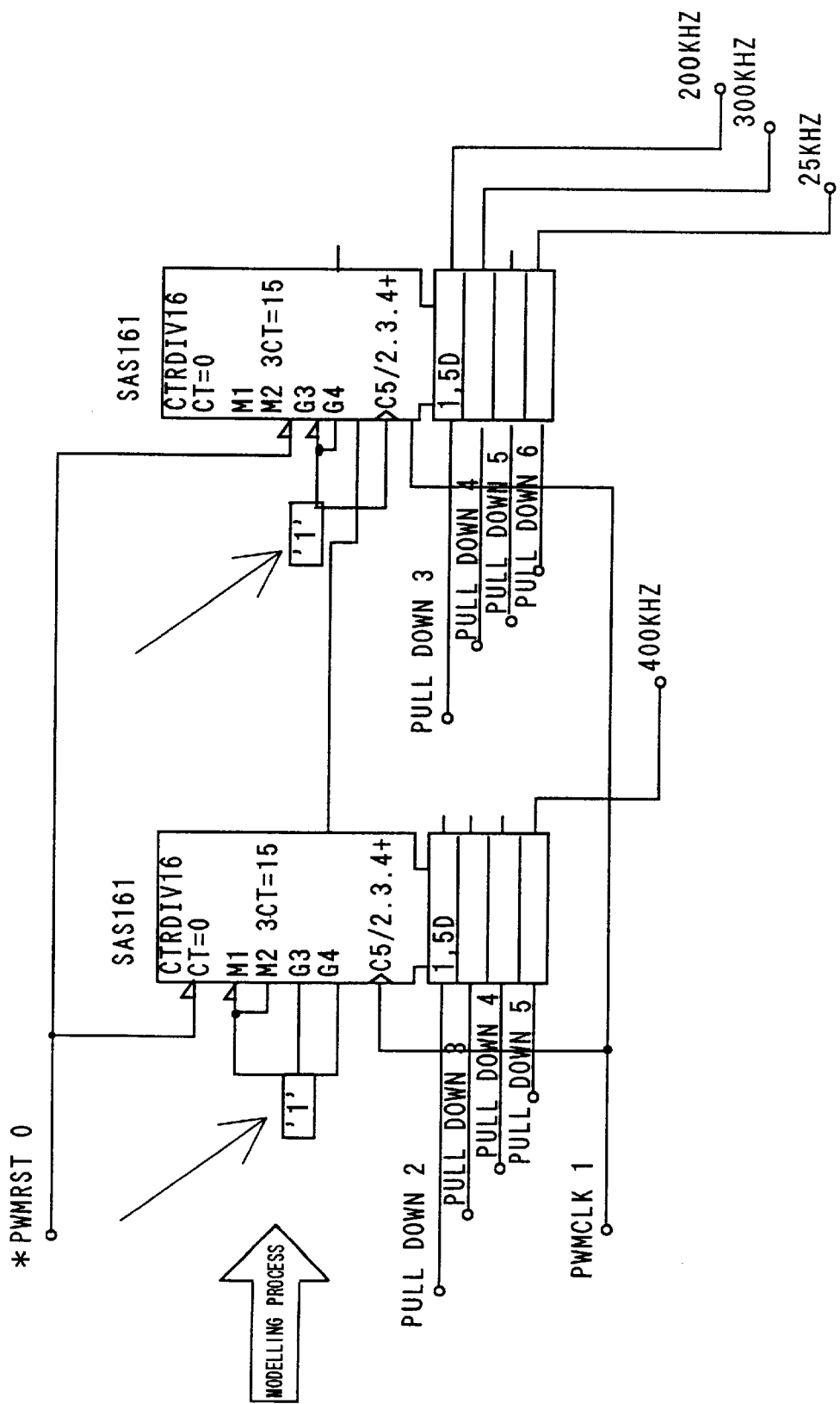
FIG. 18 is a circuit diagram showing a concrete example after the data is converted to the model according to the conversion rule (1) used in the method and apparatus for circuit conversion for simulation according to the present invention.

At first, the circuit entry tool 10 prepares the digital/analog hybrid circuit shown in FIG. 17 in the interactive system on the screen of the display 11 using the symbol library 12, and stores circuit data for the digital/analog hybrid circuit shown in FIG. 17 described in the VHDL or the like, obtained through the process of preparing a circuit database by the circuit database preparing section 13, in the circuit database 14.

Then, the circuit data classifying means 21 in the circuit converting apparatus for simulation (model converting section) 20 receives circuit data for the digital/analog hybrid circuit shown in FIG. 17 from the circuit database 14, the data stored therein, in the circuit entry tool 10, and classifies the received circuit data for the digital/analog hybrid circuit from the circuit attributes into circuit symbols (Refer to FIG. 2). Further, the circuit data largely classified into circuit symbols is subdivided into analog symbols, and the analog symbols are subdivided into data for each analog function, namely into "resistance" herein.

Stored in the circuit conversion rule table 22 are conversion rules (Refer to Table 1) each set for each of the types classified by the circuit data classifying means 21. Herein, a resistance circuit (resistor R) connected to an input pin for the digital circuit symbol DS as well as to the power source each shown in FIG. 17 is modelled as a digital constant value "1" according to the conversion rule (1) (Refer to FIG. 3).

After the operation described above, the conversion rule collating means 23 specifies the conversion rule (1) corresponding to a type of circuit data classified by the circuit data classifying means 21 for each classified circuit data according to collation of conversion rules with each other using the circuit conversion rule table 22.

Then, the circuit model building means 24 converts the digital/analog hybrid circuit (Refer to FIG. 17) received from the circuit entry tool 10 to a circuit model suited for digital simulation by converting the circuit data classified by the circuit data classifying means 21 thereto according to the conversion rule (1) specified by the conversion rule collating means 23, and stores the circuit data (Refer to FIG. 18) converted to the digital circuit model in the circuit database 25.

Then, the high-speed digital simulator 30 reads the control data in the control data file 31 as well as the circuit data (Refer to FIG. 18) stored in the circuit database 25, and displays a result of simulation on the display 32.

The model converting process is executed in each of the conversion examples shown in FIG. 19 to FIG. 43 according to the same sequence as described above, so that description is made hereinafter specifically only for what type of circuit model the data is converted to and with which conversion rule is used therefor.

Figure 19:
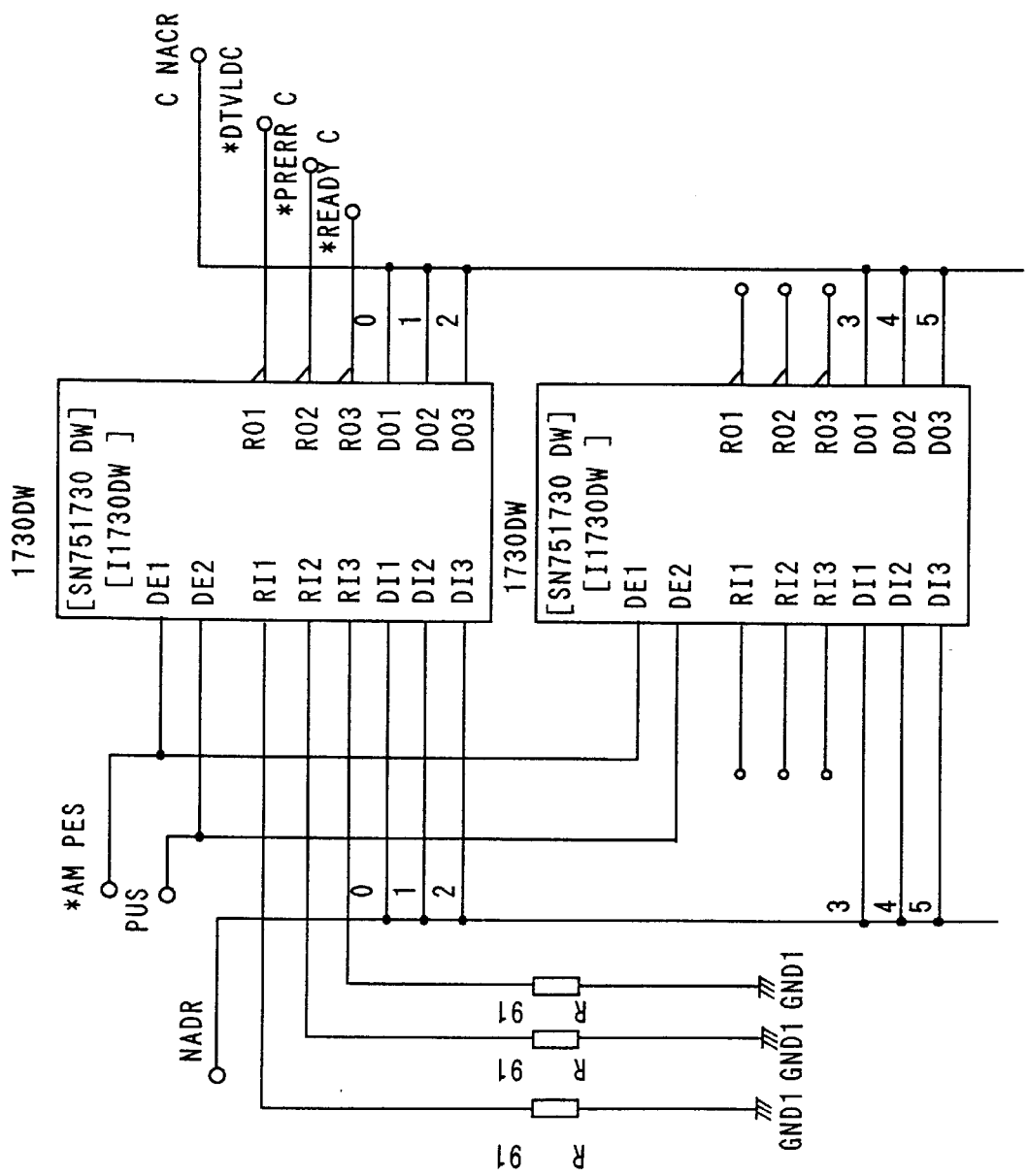
FIG. 19 is a circuit diagram showing a concrete example before the data is converted to the model according to the conversion rule (2) used in the method and apparatus for circuit conversion for simulation according to the present invention.
Figure 20:
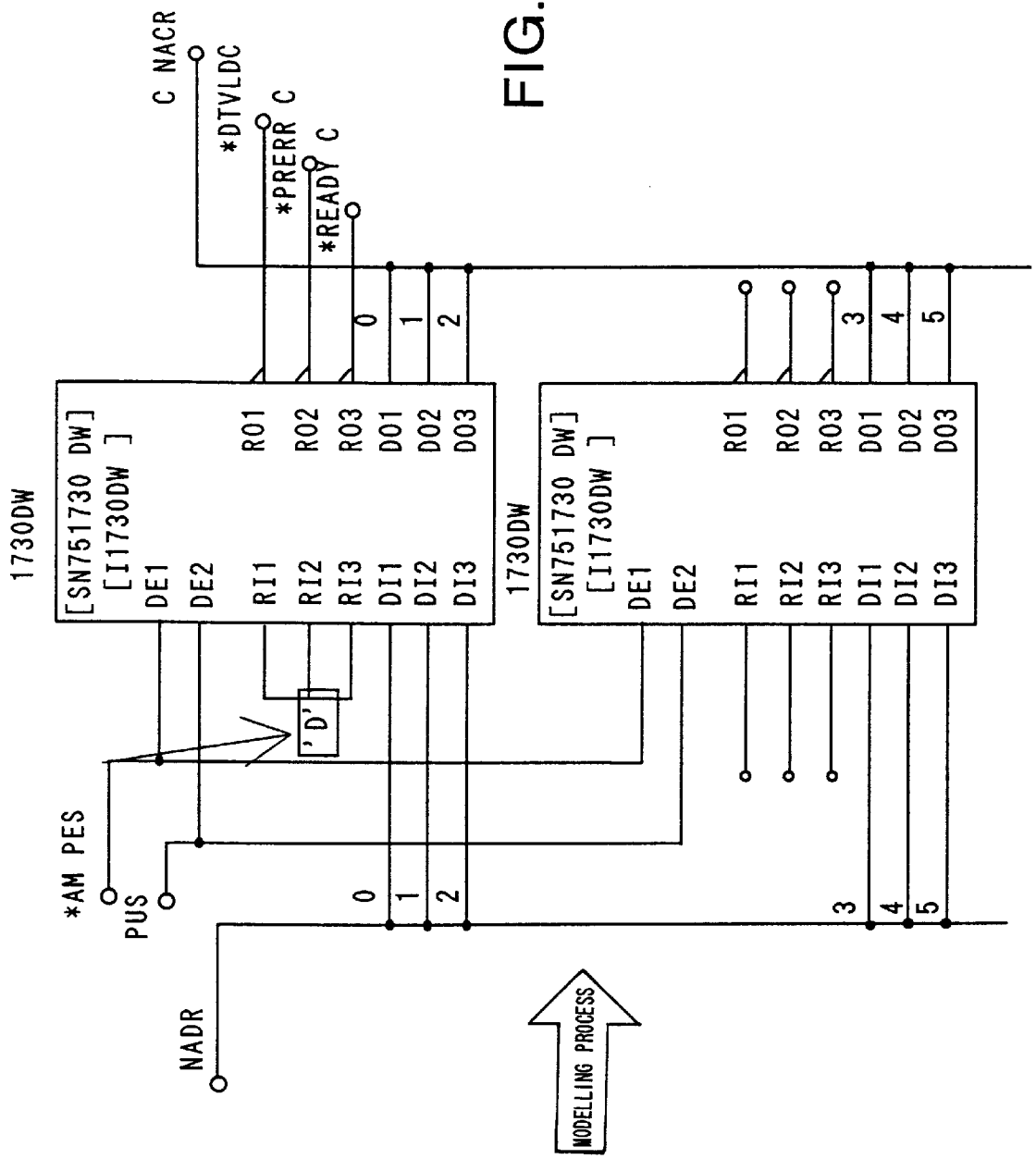
FIG. 20 is a circuit diagram showing a concrete example after the data is converted to the model according to the conversion rule (2) used in the method and apparatus for circuit conversion for simulation according to the present invention.

As shown in FIGS. 19 and 20, the resistance circuit (resistor R) connected to the input pins in the digital circuit symbol DS as well as to the grounds is modelled as a digital constant value "0" according to the conversion rule (2).

As shown in FIG. 21, the analog symbol for low resistance (resistor R) is modelled as a digital circuit based on through gate connection according to the conversion rule (3).

Figure 22:
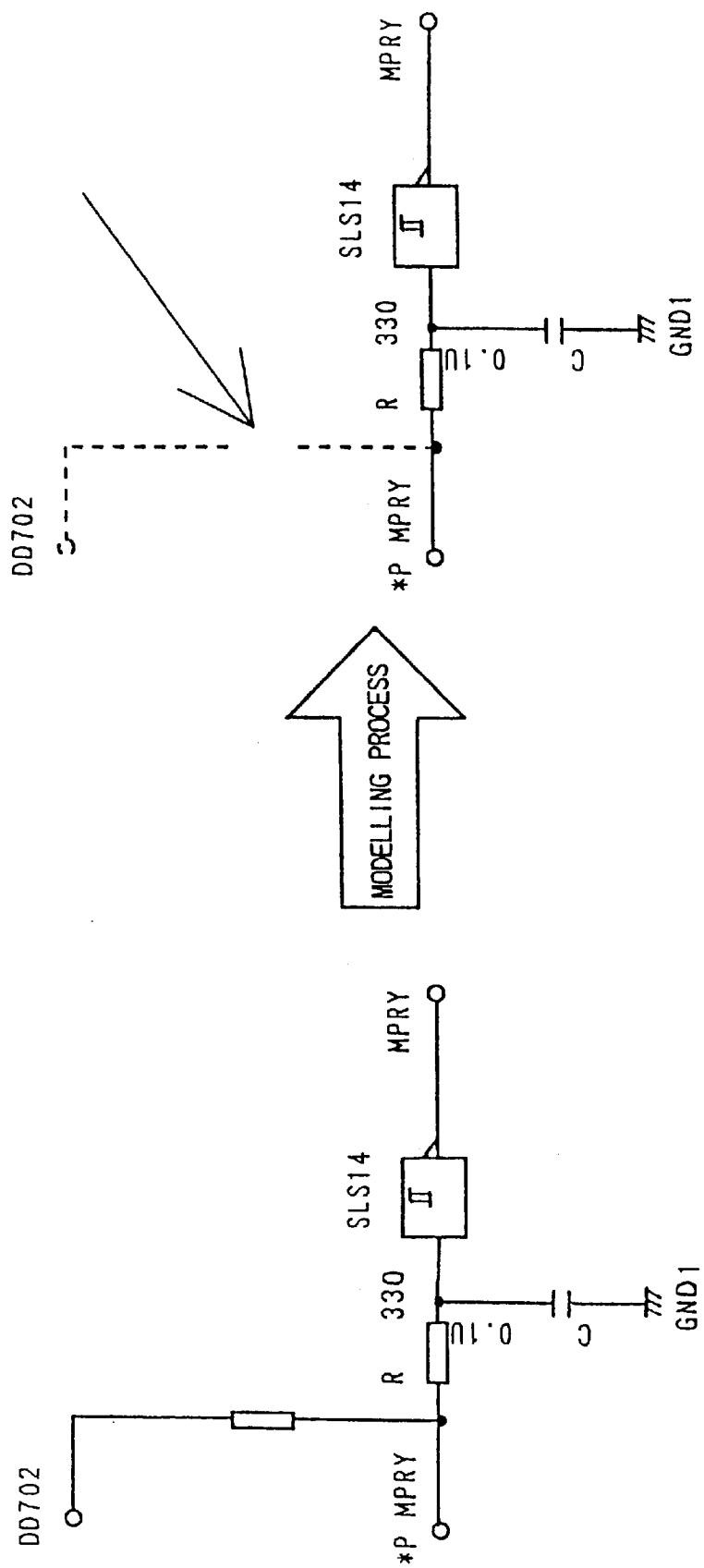
FIG. 22 is a circuit diagram showing a concrete example of conversion according to the conversion rule (4) used in the method and apparatus for circuit conversion for simulation according to the present invention.

As shown in FIG. 22, the analog symbol for high resistance (resistor R) is modelled as a digital circuit by being deleted according to the conversion rule (4).

As shown in FIG. 23, the by-pass capacitor C for the power source is modelled as a digital circuit by being deleted according to the conversion rule (5).

Figure 24:
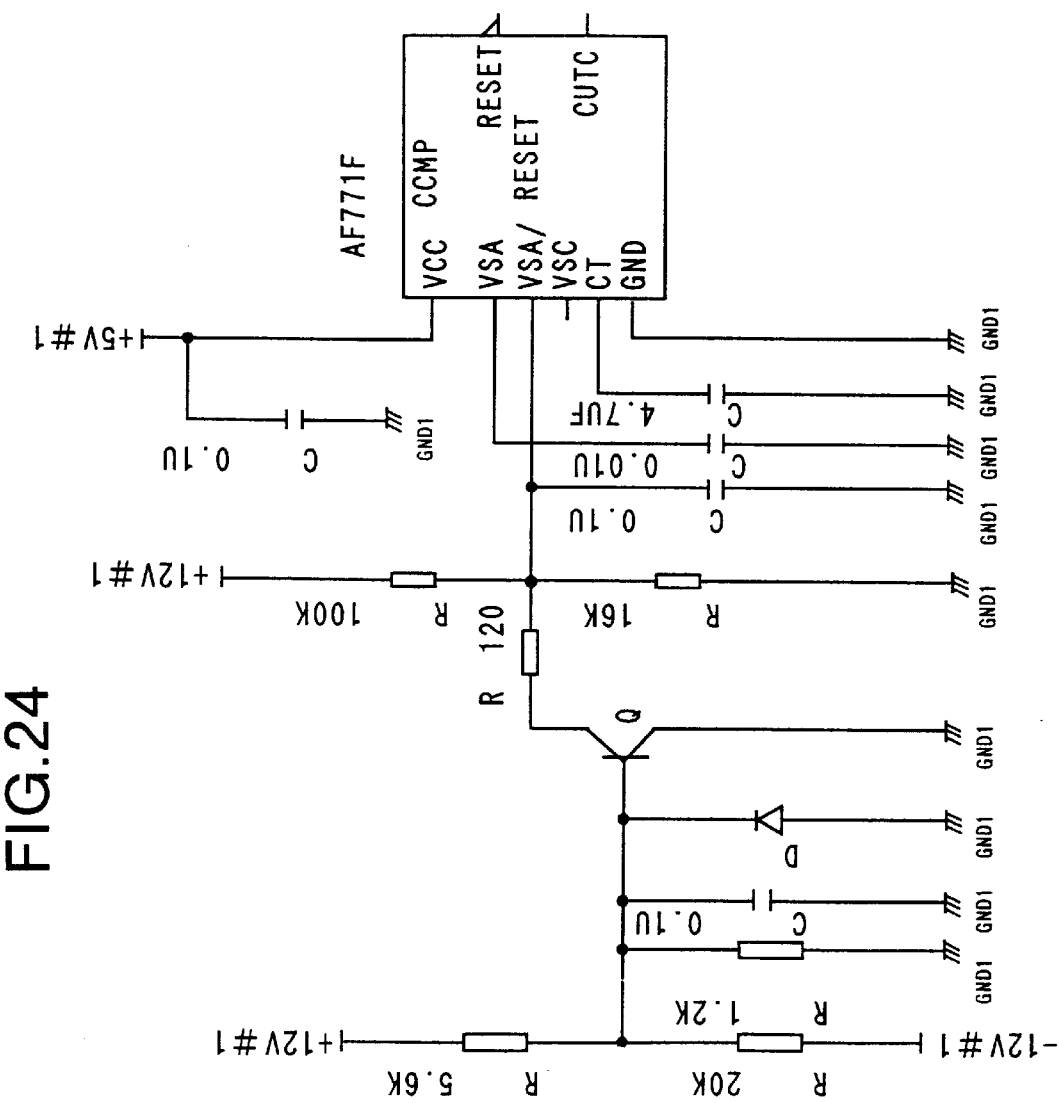
FIG. 24 is a circuit diagram showing a concrete example before the data is converted to the model according to the conversion rule (6) used in the method and apparatus for circuit conversion for simulation according to the present invention.
Figure 25:
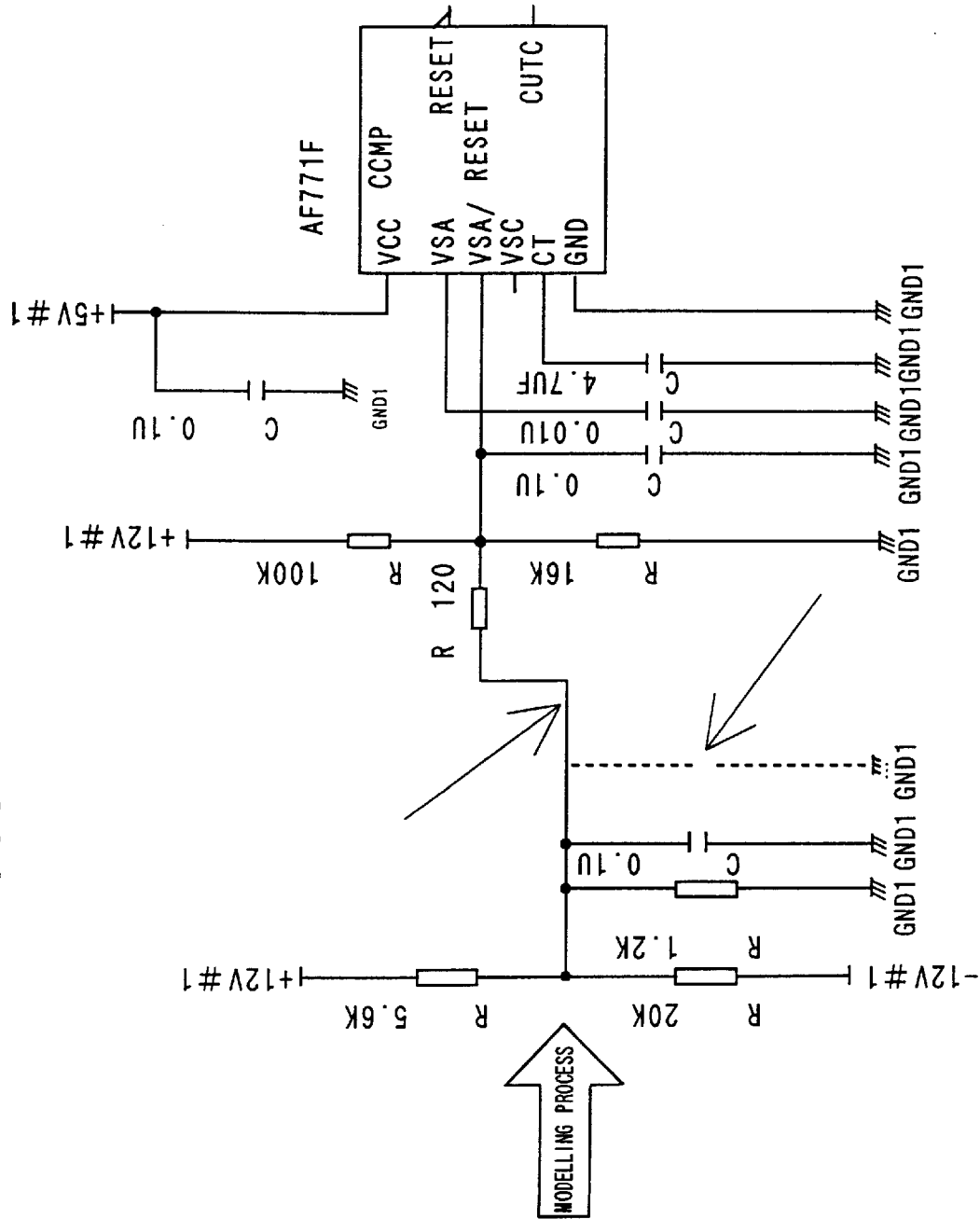
FIG. 25 is a circuit diagram showing a concrete example after the data is converted to the model according to the conversion rule (6) used in the method and apparatus for circuit conversion for simulation according to the present invention.

As shown in FIGS. 24 and 25, the analog circuit comprising the transistor Q and diode D is modelled as a digital circuit by way of through gate connection or by being deleted according to the conversion rule (6).

Figure 26:
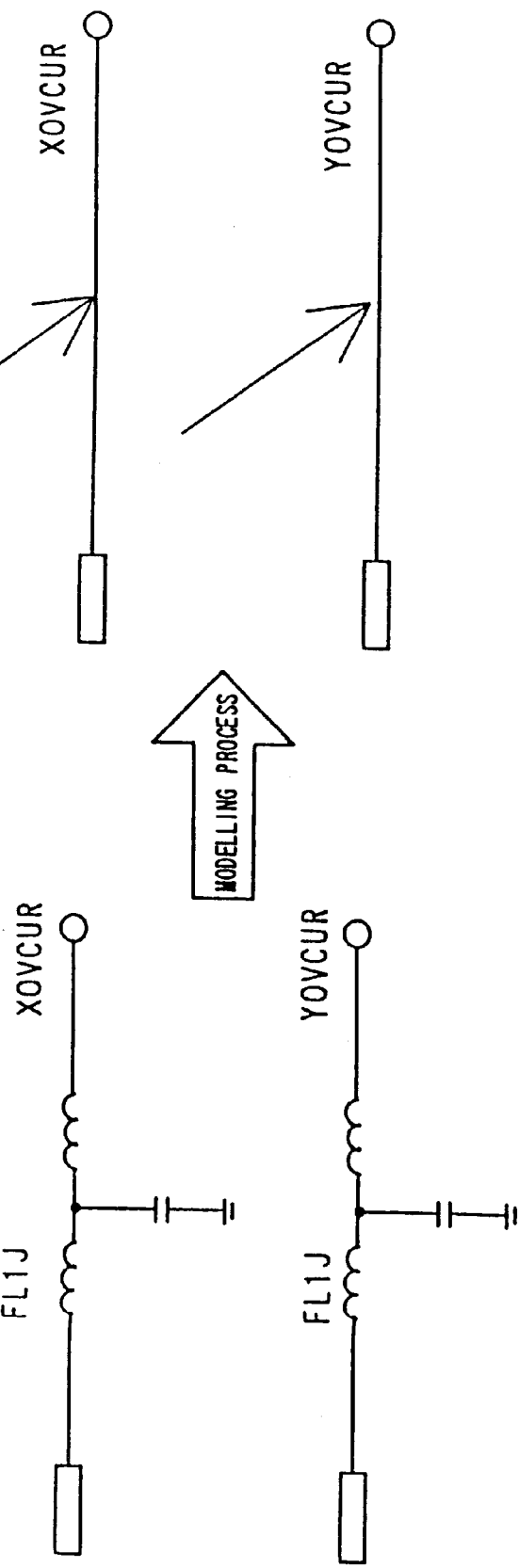
FIG. 26 is a circuit diagram showing a concrete example of conversion according to the conversion rule (7) used in the method and apparatus for circuit conversion for simulation according to the present invention.

As shown in FIG. 26, the filter circuit "FL1J" is modelled as a digital circuit by way of through gate connection according to the conversion rule (7).

Figure 27:
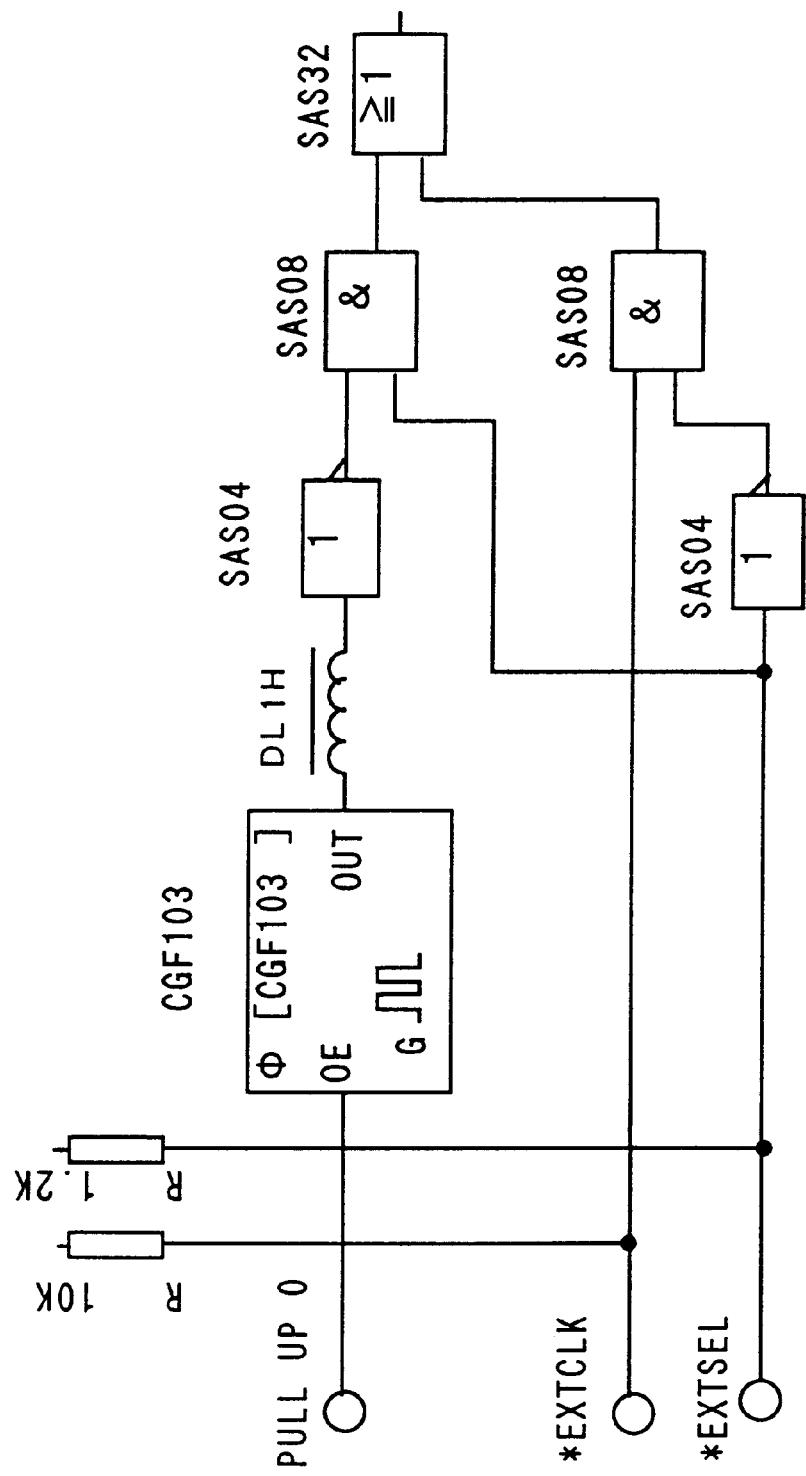
FIG. 27 is a circuit diagram showing a concrete example before the data is converted to the model according to the conversion rule (8) used in the method and apparatus for circuit conversion for simulation according to the present invention.
Figure 28:
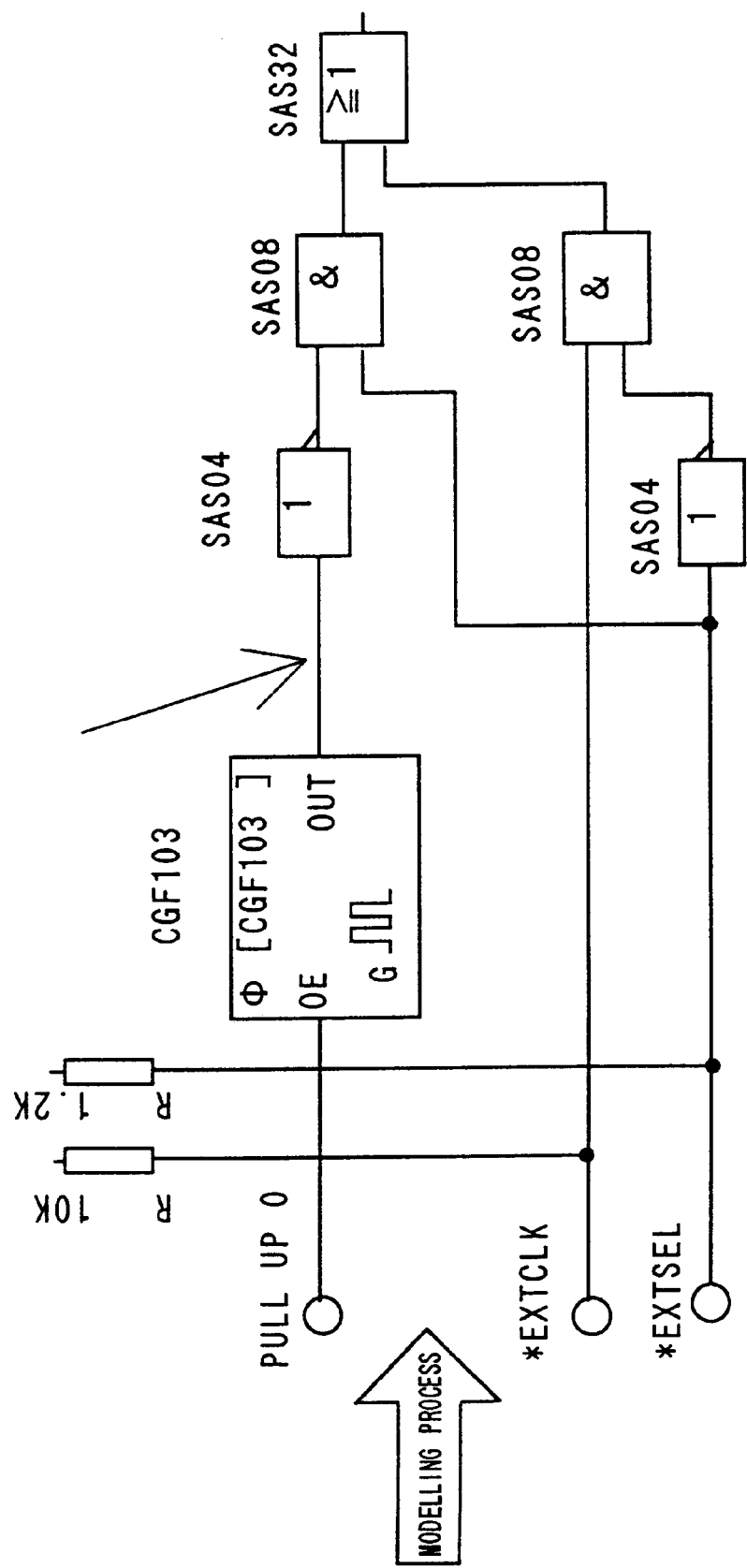
FIG. 28 is a circuit diagram showing a concrete example after the data is converted to the model according to the conversion rule (8) used in the method and apparatus for circuit conversion for simulation according to the present invention.

As shown in FIGS. 27 and 28, the delay circuit "DL1H" is modelled as a digital circuit by way of through gate connection according to the conversion rule (8). It should be noted that, in this case, a delay control gate may also be inserted into the above section.

Figure 30:
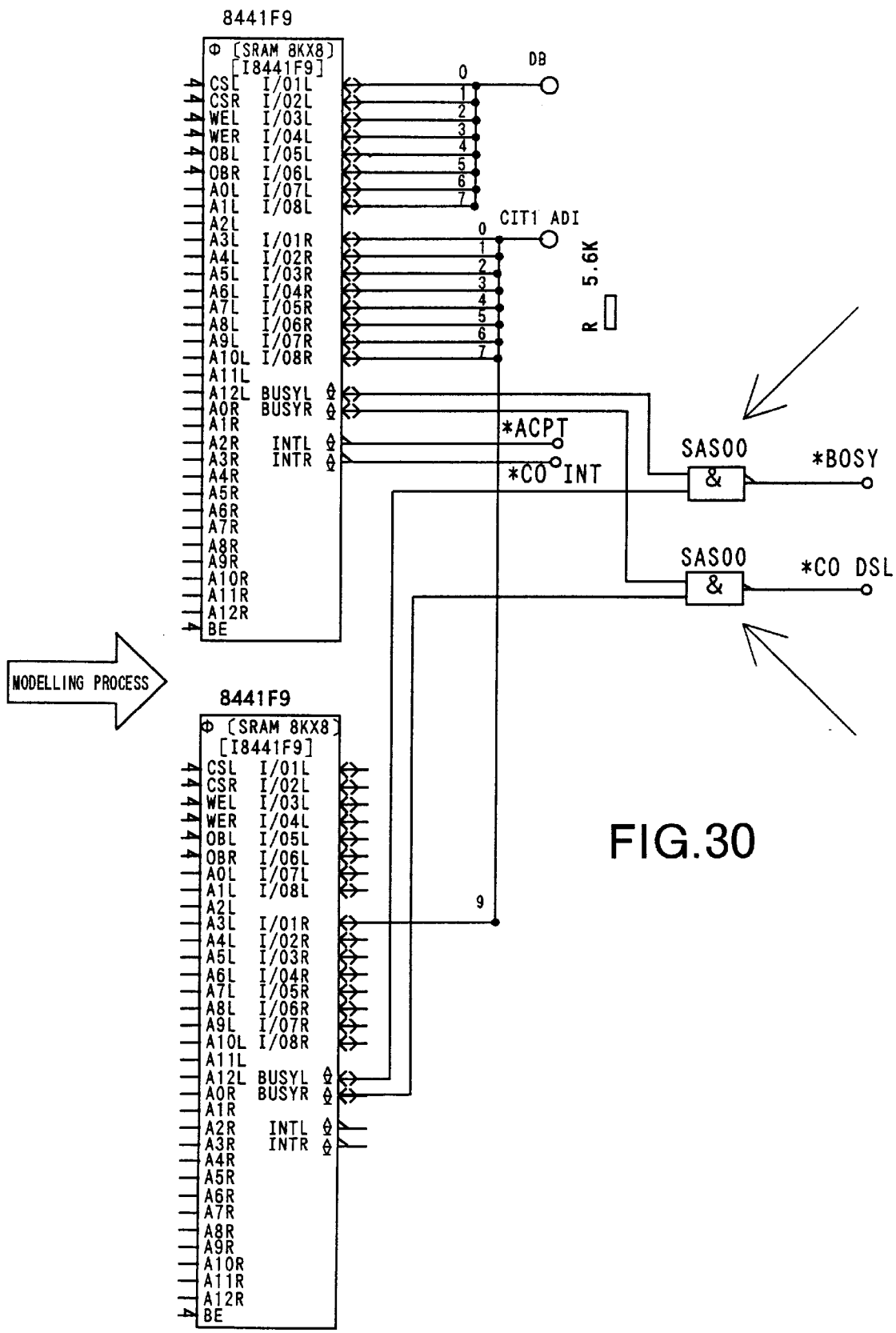
FIG. 30 is a circuit diagram showing a concrete example after the data is converted to the model according to the conversion rule (9) used in the method and apparatus for circuit conversion for simulation according to the present invention.

As shown in FIGS. 29 and 30, the resistor R based on the open collector dot connection is modelled as a digital circuit by being replaced with an AND circuit "&" according to the conversion rule (9).

Figure 31:
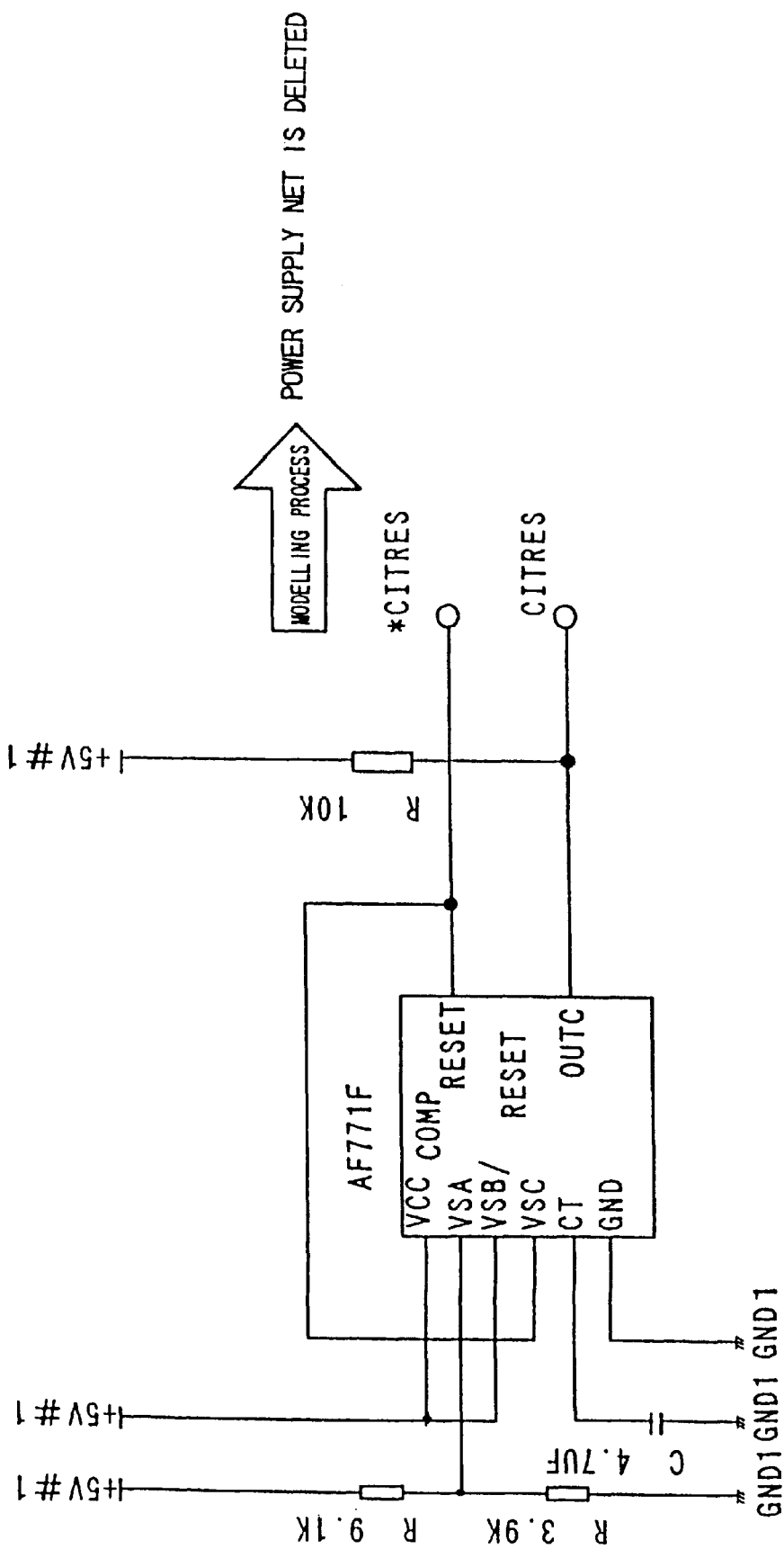
FIG. 31 is a circuit diagram showing a concrete example of conversion according to the conversion rule (10) used in the method and apparatus for circuit conversion for simulation according to the present invention.

As shown in FIG. 31, the power source net (power circuit) is searched from the power source symbols to be deleted according to the conversion rule (10).

Figure 32:
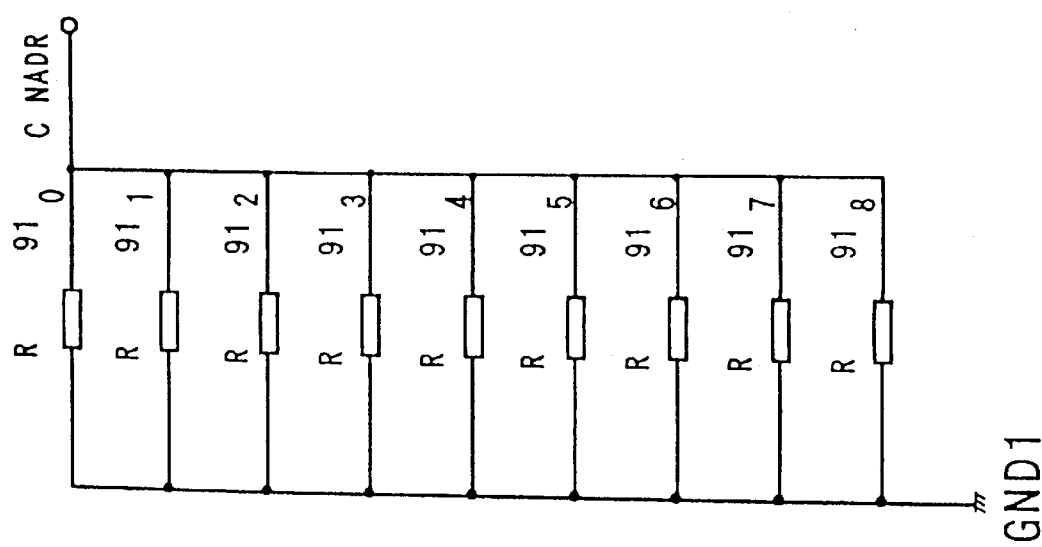
FIG. 32 is a circuit diagram showing a concrete example of conversion according to the conversion rule (11) used in the method and apparatus for circuit conversion for simulation according to the present invention.

As shown in FIG. 32, the ground net is searched from the ground symbols to be deleted according to the conversion rule (11).

Figure 33:
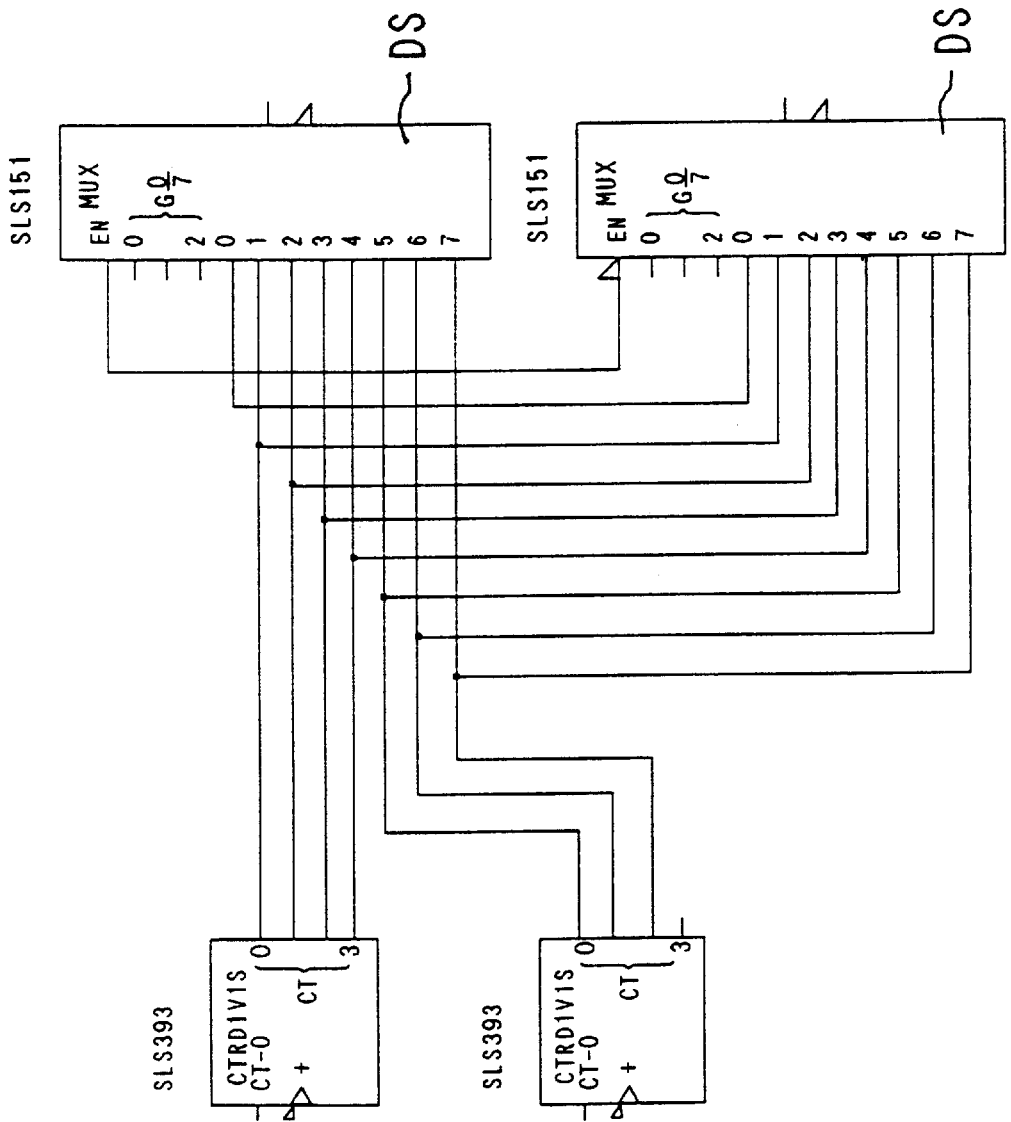
FIG. 33 is a circuit diagram showing a concrete example before the data is converted to the model according to the conversion rule (12) used in the method and apparatus for circuit conversion for simulation according to the present invention.
Figure 34:
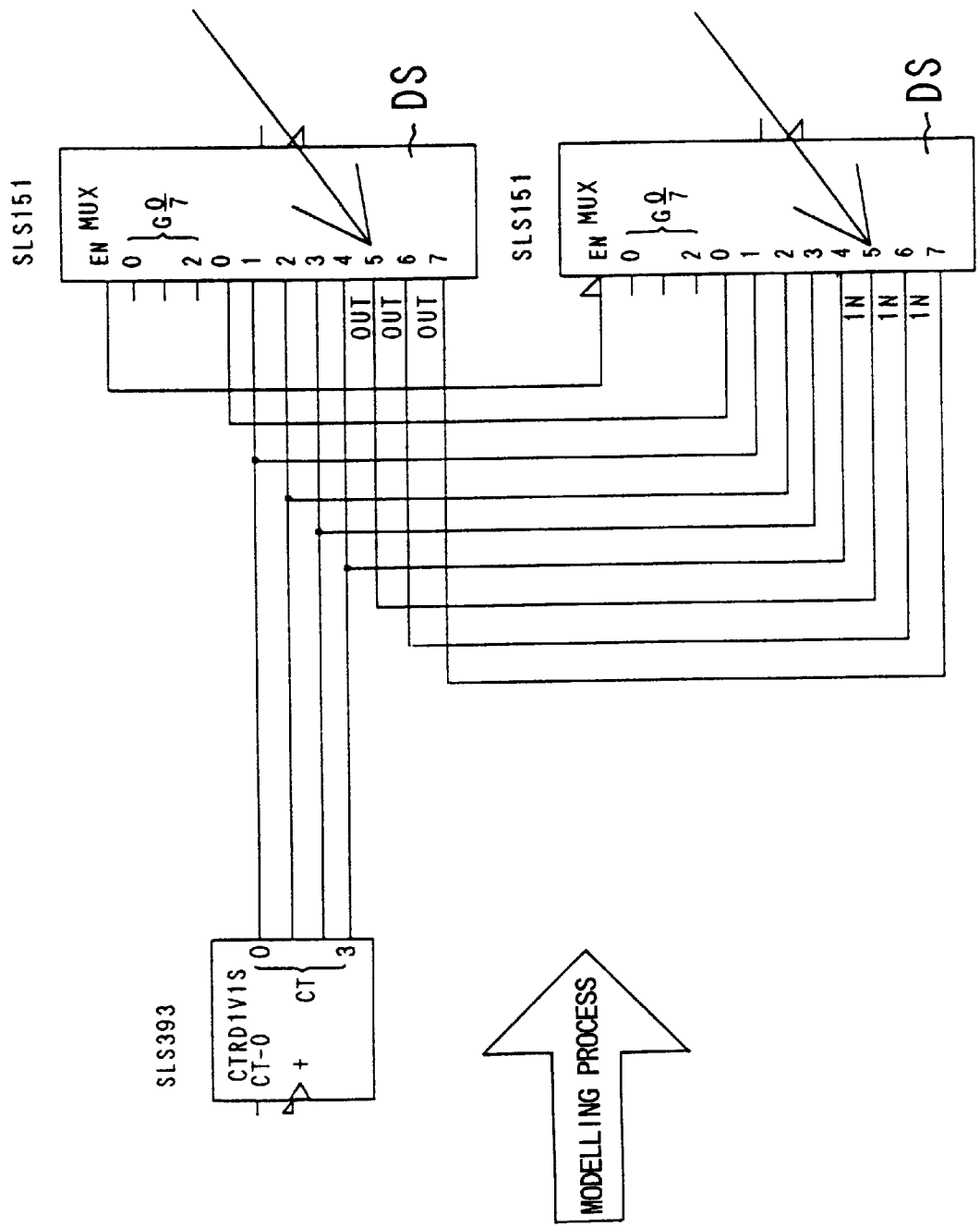
FIG. 34 is a circuit diagram showing a concrete example after the data is converted to the model according to the conversion rule (12) used in the method and apparatus for circuit conversion for simulation according to the present invention.

As shown in FIGS. 33 and 34, in a case where contradiction occurs between signal input/output attributes for the digital circuit symbol DS due to modelling, the attribute for the symbol pin is optimized for the modelled circuit according to the conversion rule (12).

Figure 35:
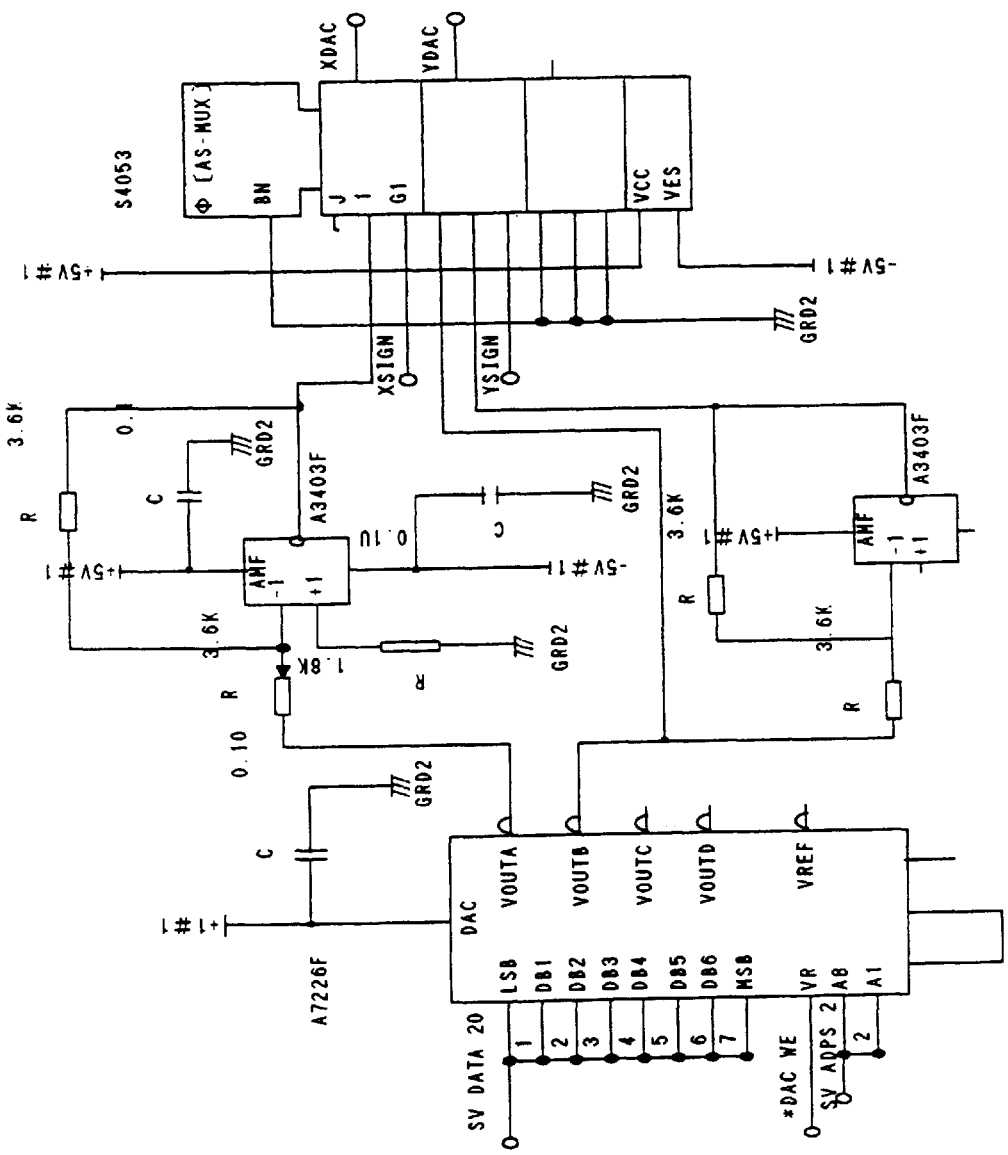
FIG. 35 is a circuit diagram showing a concrete example before the data is converted to the model according to the conversion rule (13) used in the method and apparatus for circuit conversion for simulation according to the present invention.
Figure 36:
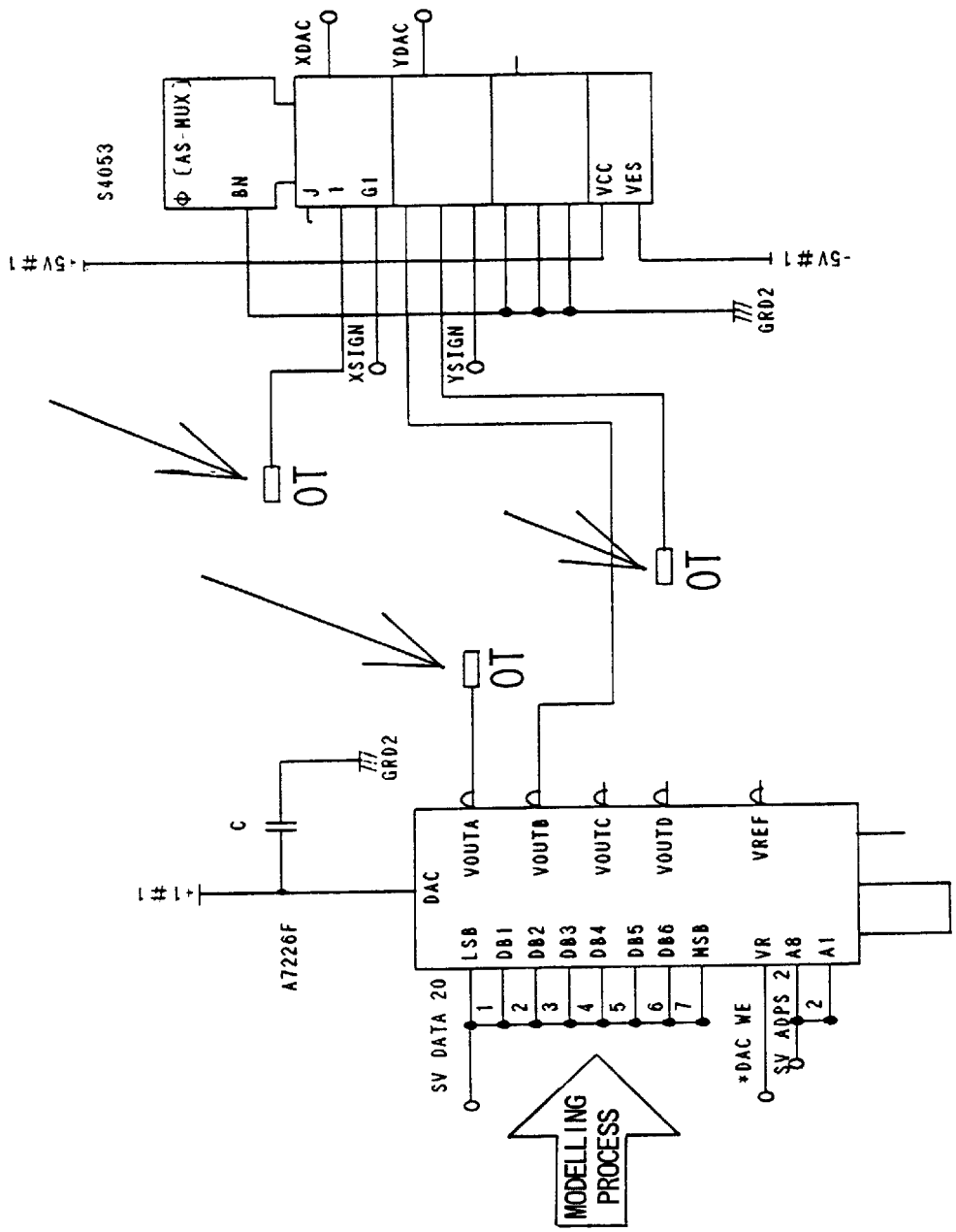
FIG. 36 is a circuit diagram showing a concrete example after the data is converted to the model according to the conversion rule (13) used in the method and apparatus for circuit conversion for simulation according to the present invention.

As shown in FIGS. 35 and 36, in a case where attributes for an outside terminal OT and for the symbol pin are identical to each other due to deletion of a circuit connected to the outside terminal because of circuit conversion, the attribute for the outside terminal OT is optimized for the modelled circuit according to the conversion rule (13).

Figure 37:
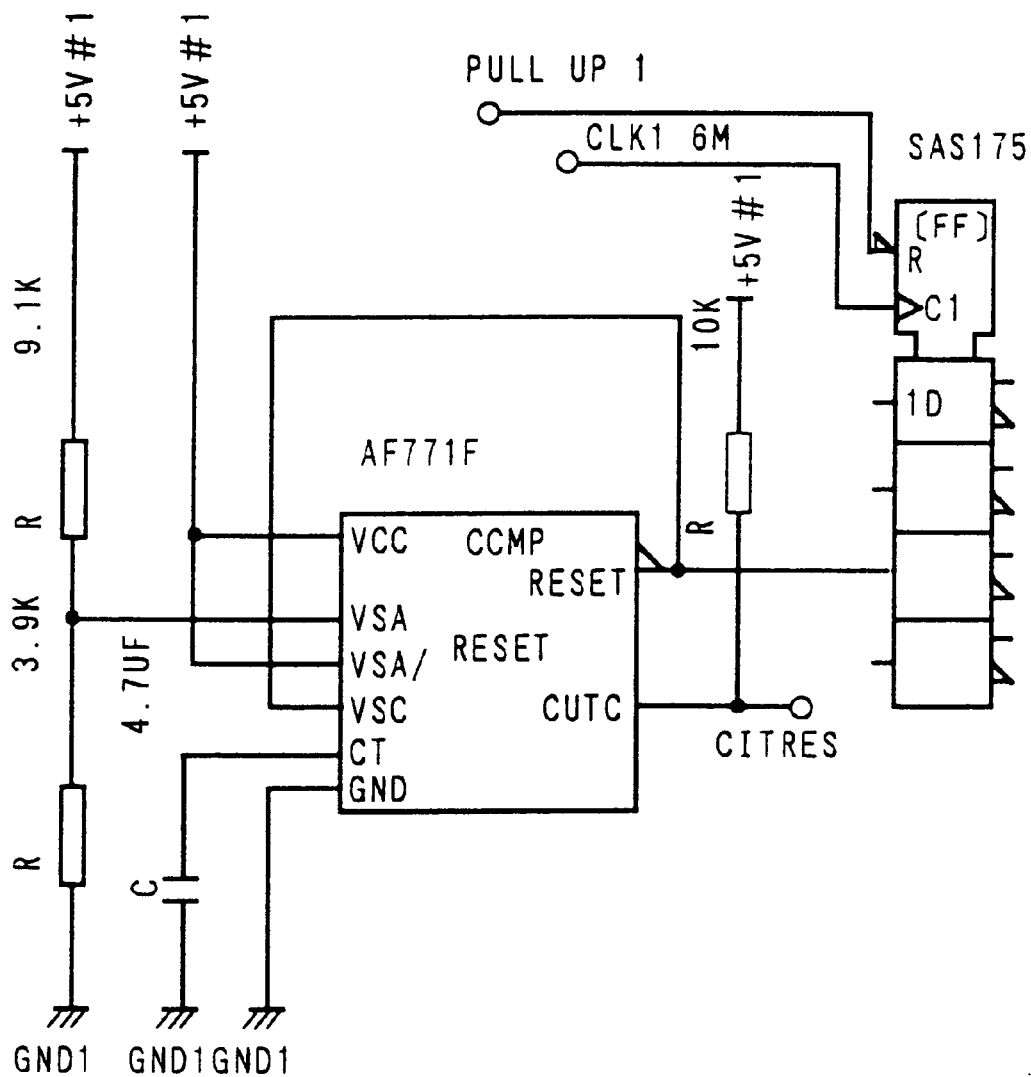
FIG. 37 is a circuit diagram showing a concrete example before the data is converted to the model according to the conversion rule (14) used in the method and apparatus for circuit conversion for simulation according to the present invention.
Figure 38:
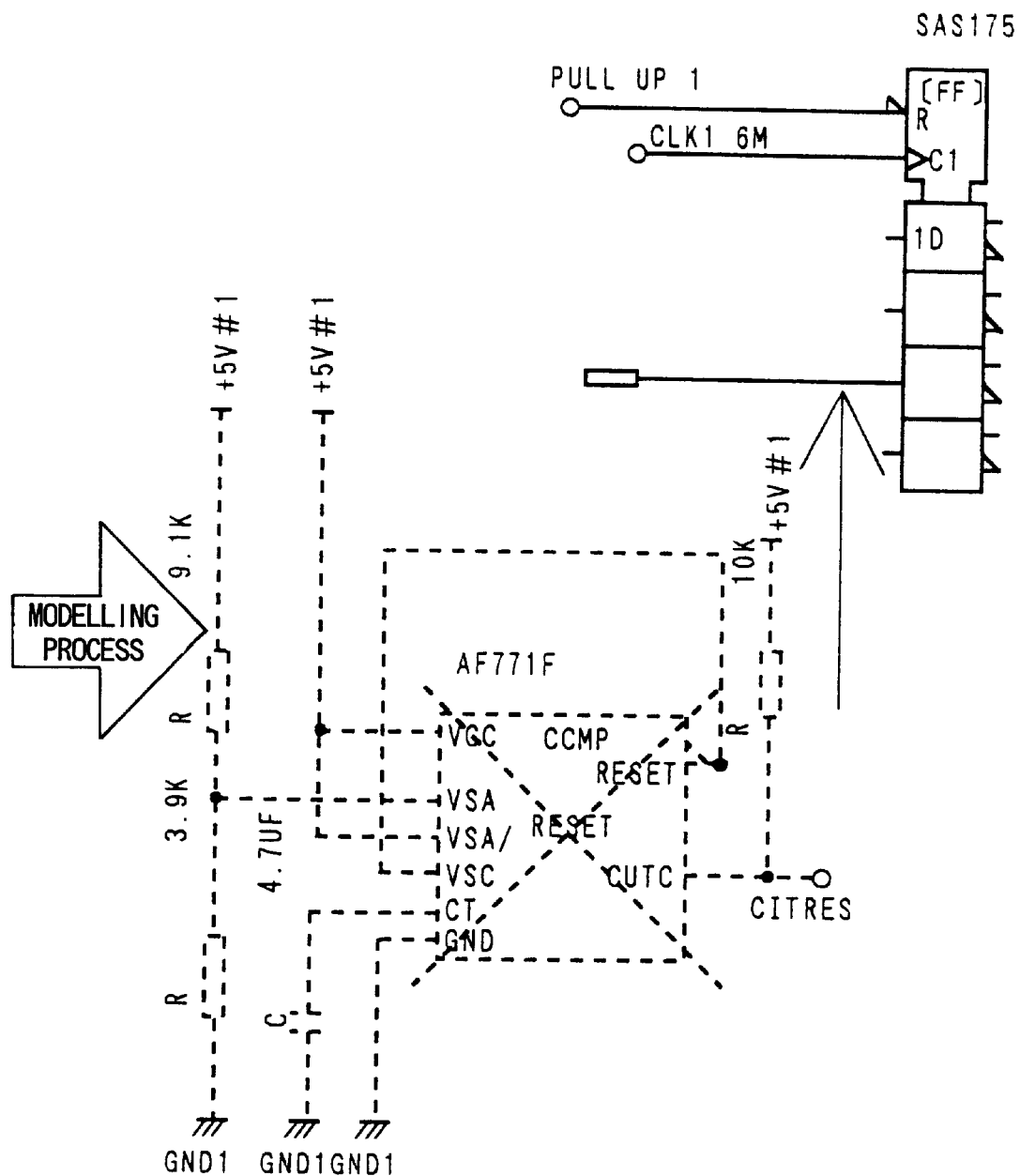
FIG. 38 is a circuit diagram showing a concrete example after the data is converted to the model according to the conversion rule (14) used in the method and apparatus for circuit conversion for simulation according to the present invention.

As shown in FIGS. 37, 38, in a case where a signal flow is interrupted in the modelled circuit, an outside terminal OT to enable transaction of control signals from the outside is added thereto according to the conversion rule (14).

Figure 39:
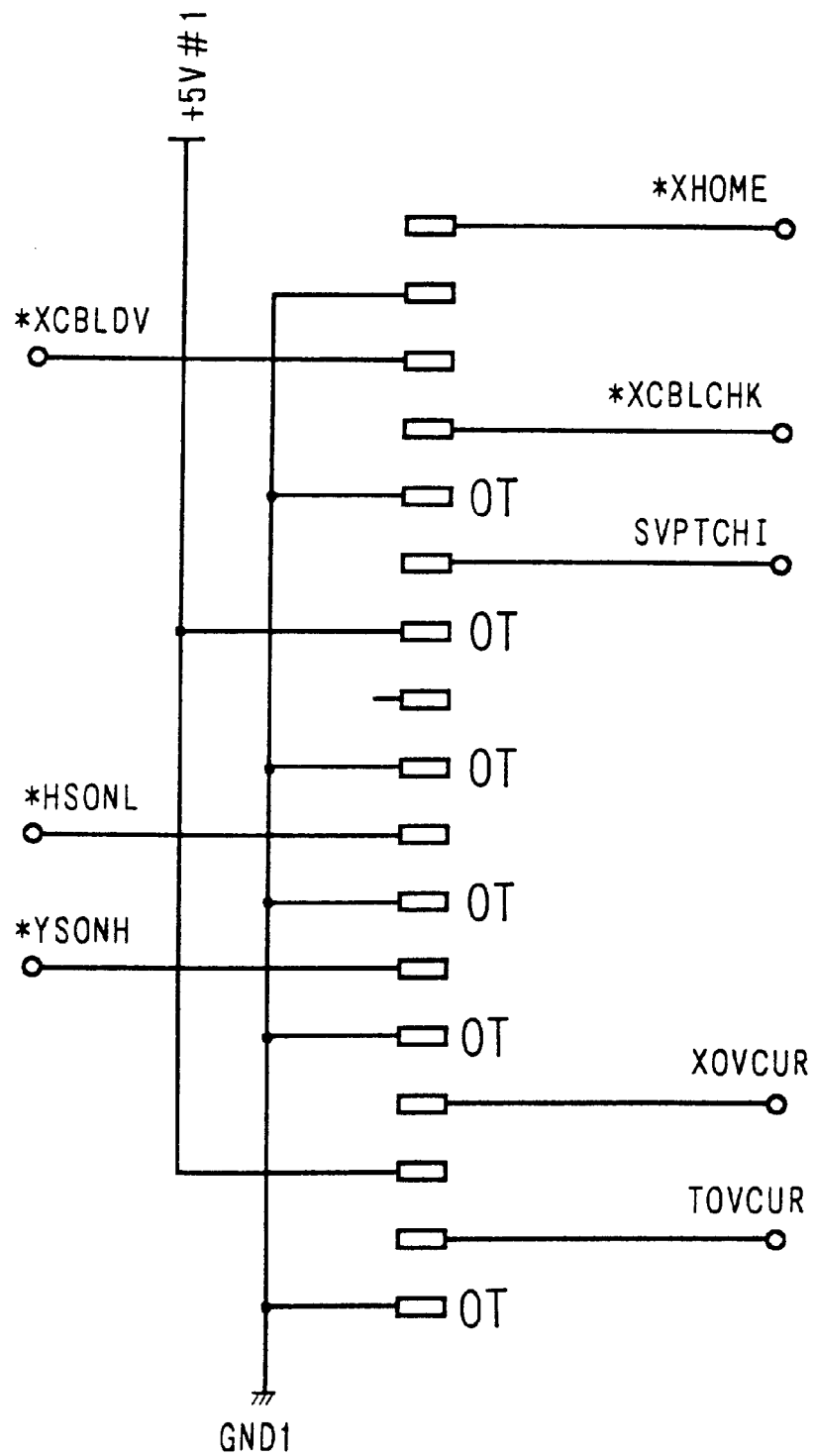
FIG. 39 is a circuit diagram showing a concrete example before the data is converted to the model according to the conversion rule (15) used in the method and apparatus for circuit conversion for simulation according to the present invention.
Figure 40:
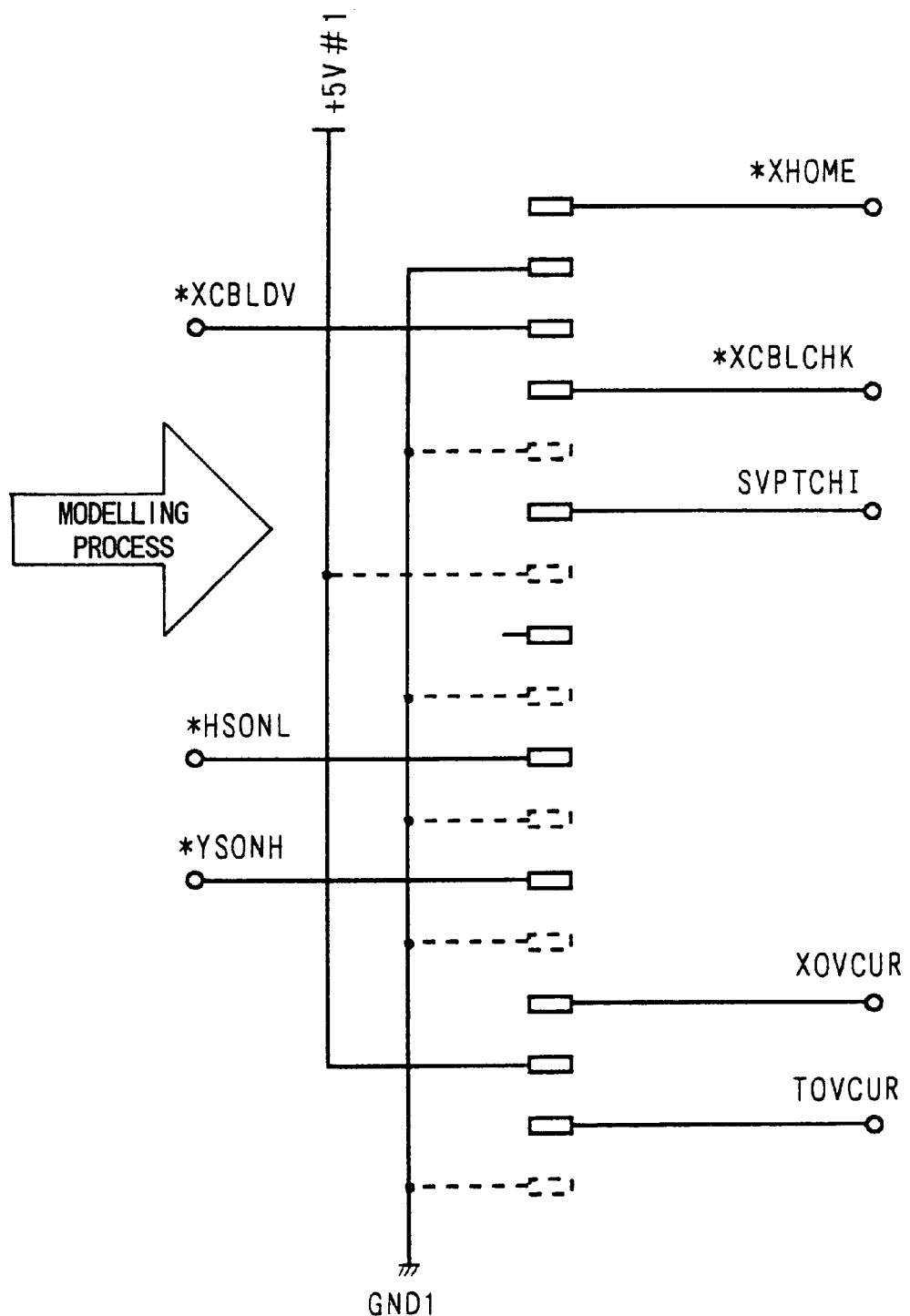
FIG. 40 is a circuit diagram showing a concrete example after the data is converted to the model according to the conversion rule (15) used in the method and apparatus for circuit conversion for simulation according to the present invention.

As shown in FIGS. 39, 40, the digitally not-required outside terminals OT are automatically deleted according to the conversion rule (15).

Figure 41:
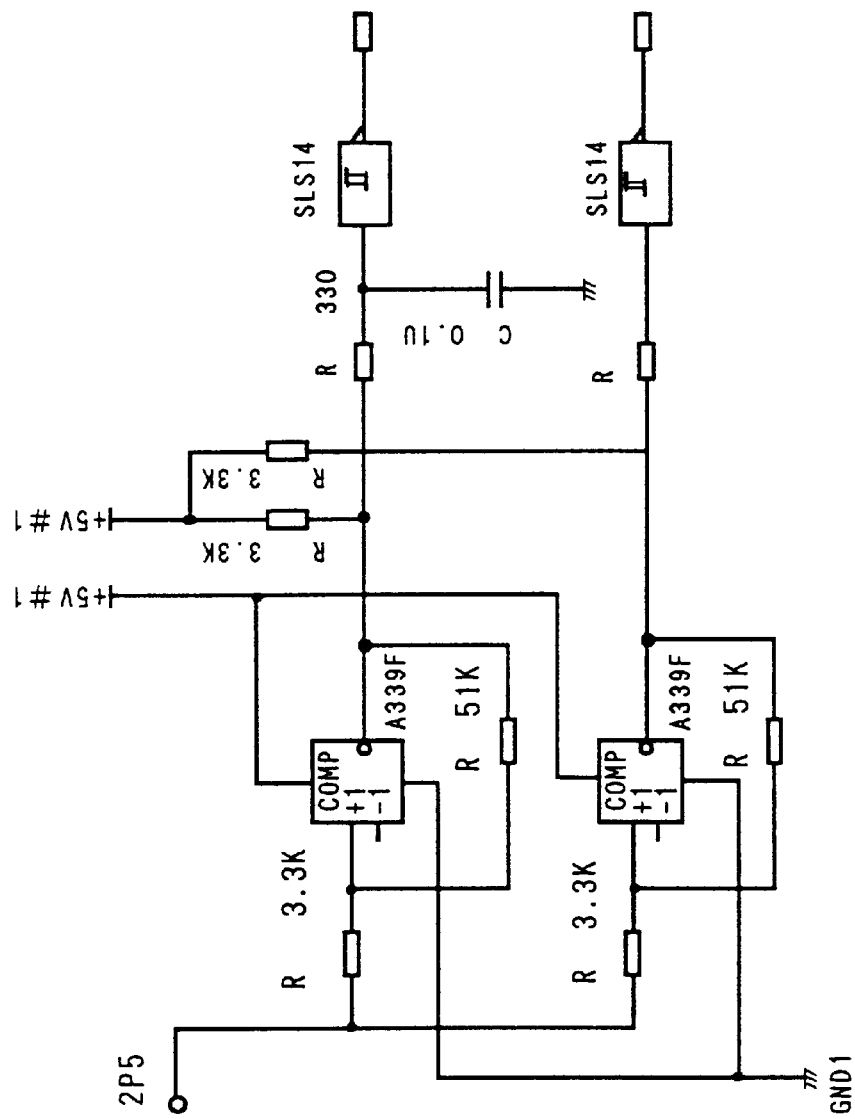
FIG. 41 is a circuit diagram showing a concrete example before the data is converted to the model according to the conversion rule (16) used in the method and apparatus for circuit conversion for simulation according to the present invention.
Figure 42:
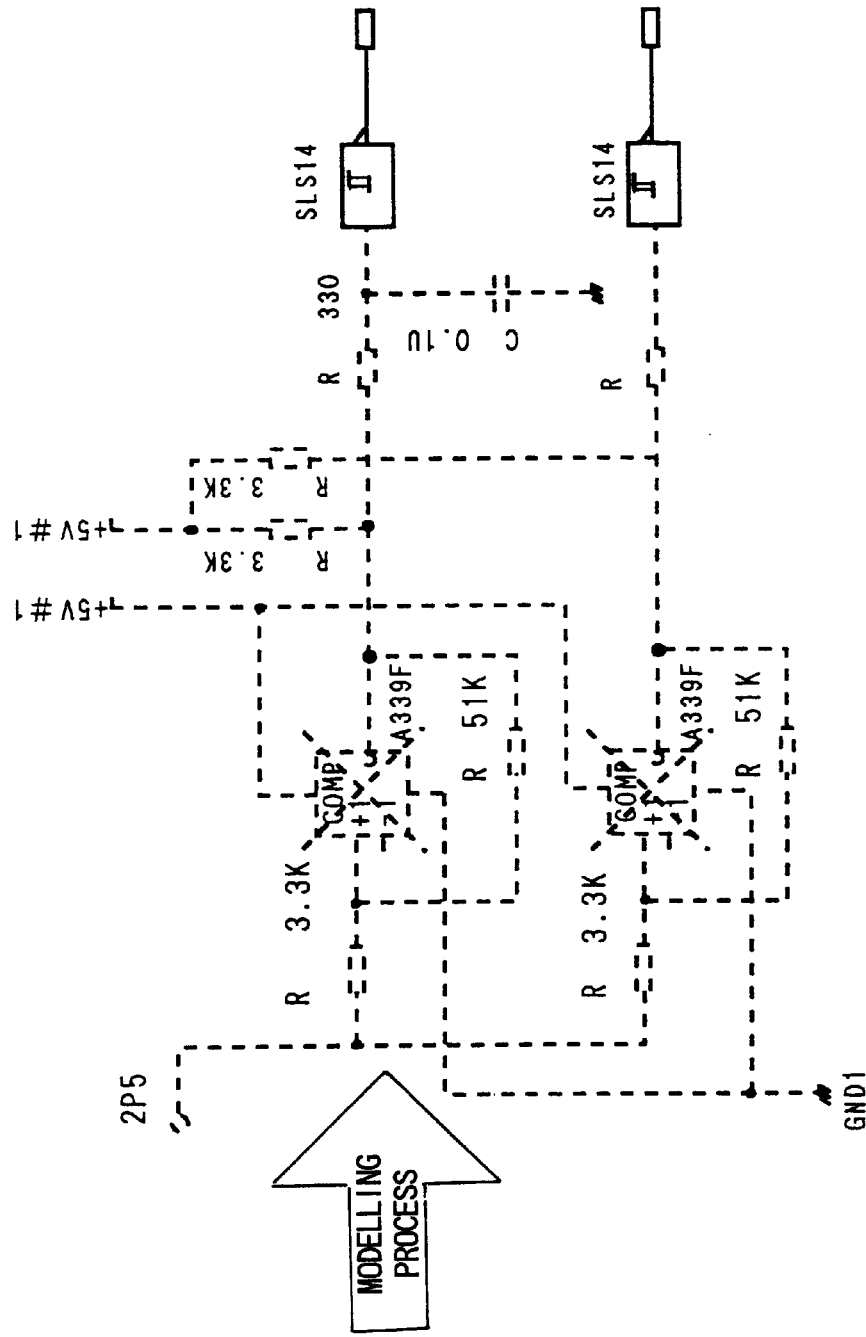
FIG. 42 is a circuit diagram showing a concrete example after the data is converted to the model according to the conversion rule (16) used in the method and apparatus for circuit conversion for simulation according to the present invention.
Figure 43:
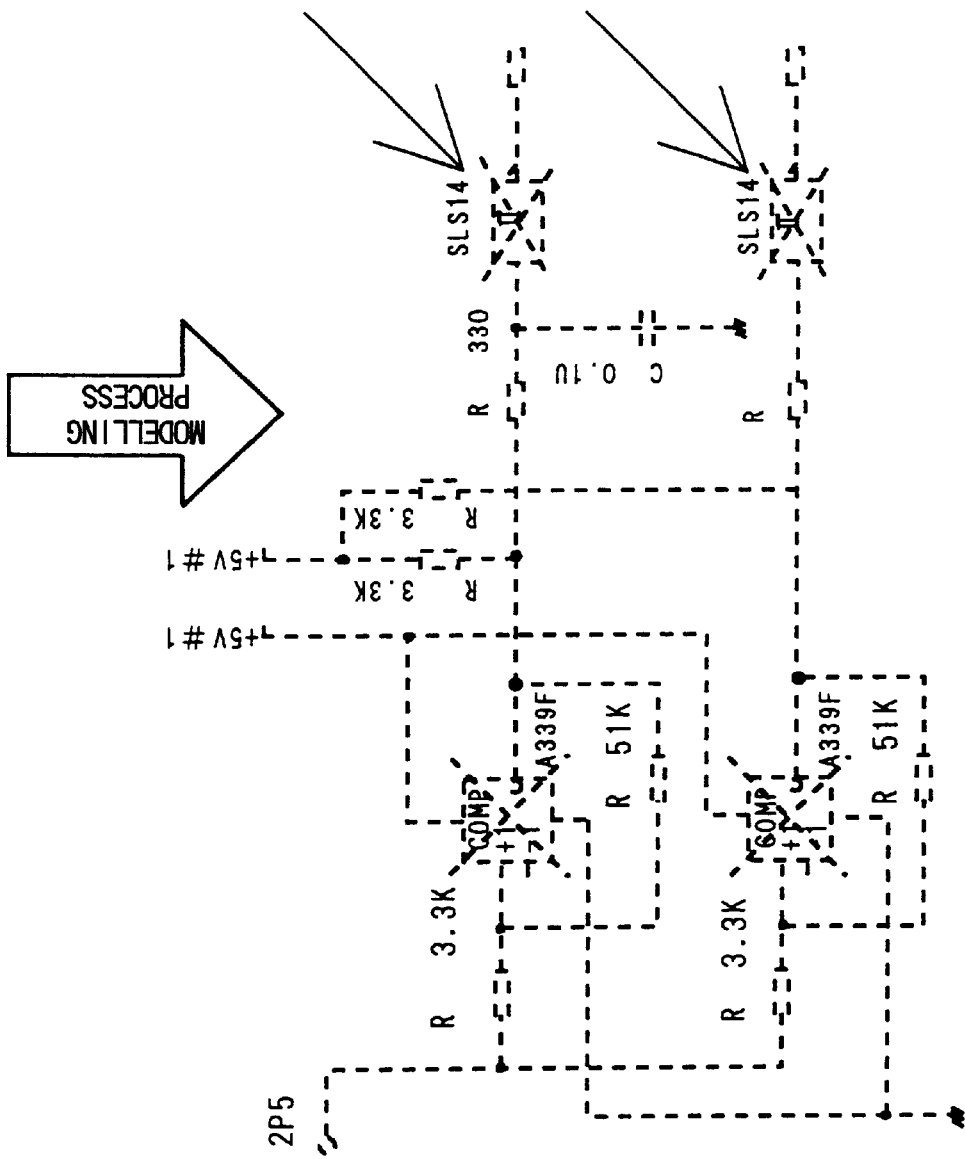
FIG. 43 is a circuit diagram showing a concrete example after the model is further converted according to the conversion rule (16) used in the method and apparatus for circuit conversion for simulation according to the present invention.

As shown in FIGS. 41 to 43, a functionally floating circuit "SLS14" generated due to the modelling process from (FIG. 41) to (FIG. 42) is automatically deleted according to the conversion rule (16) (Refer to FIG. 43).

With the modelling process according to the conversion rules as described above, a digital/analog hybrid circuit is automatically modelled to a circuit according to features of the digital simulation and the best process performance of the digital simulation can be obtained thereby. As a result, efficiency of analysis is dramatically improved, operation efficiency of simulation as well as of logic change which are repeatedly executed in the developing stage of the data processing apparatus is improved, and efficiency of logic design is also improved.

Figure 44:
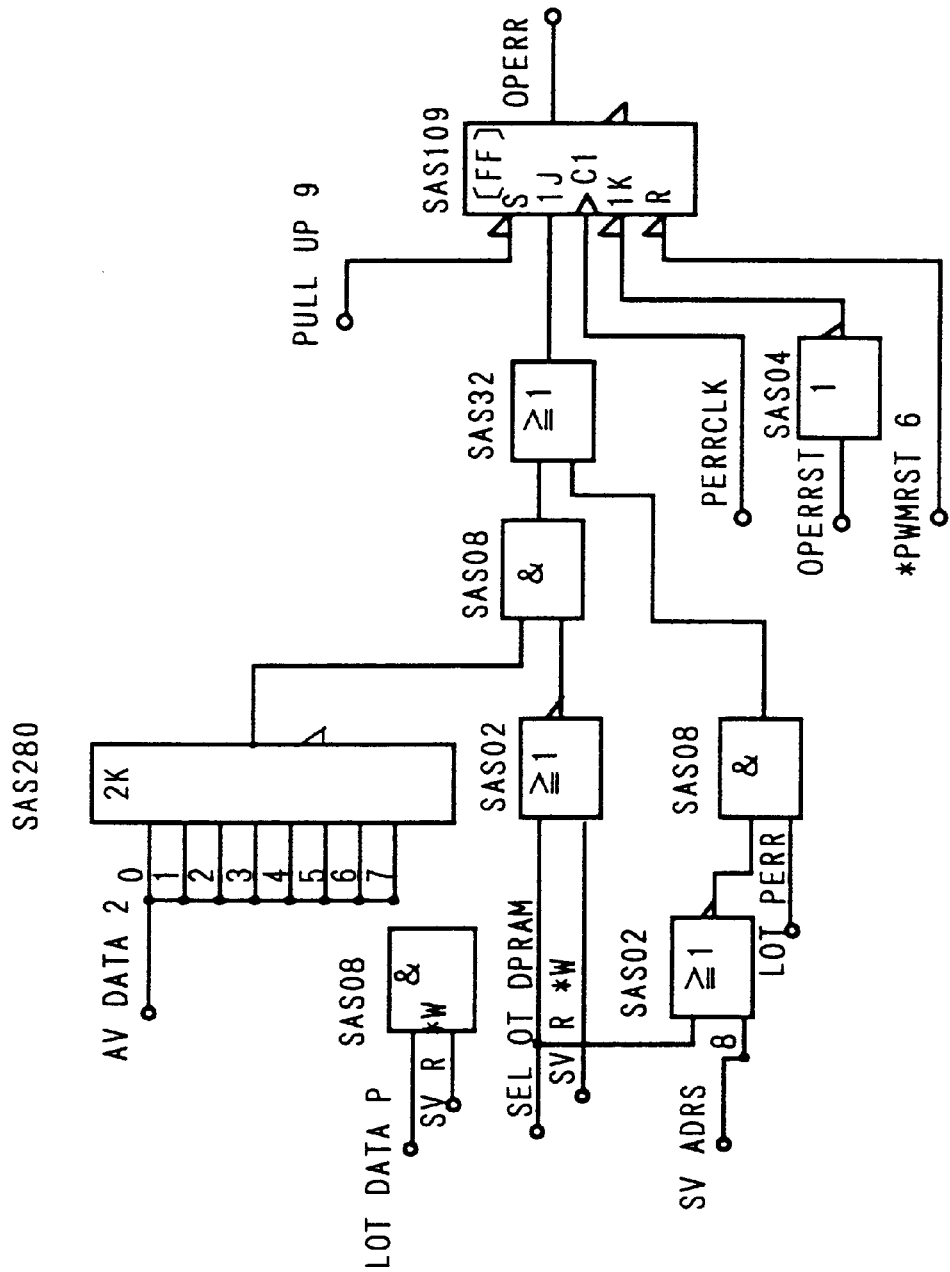
FIG. 44 is a circuit diagram showing a concrete example before an outside terminal is added thereto in the method and apparatus for circuit conversion for simulation according to the present invention.
Figure 45:
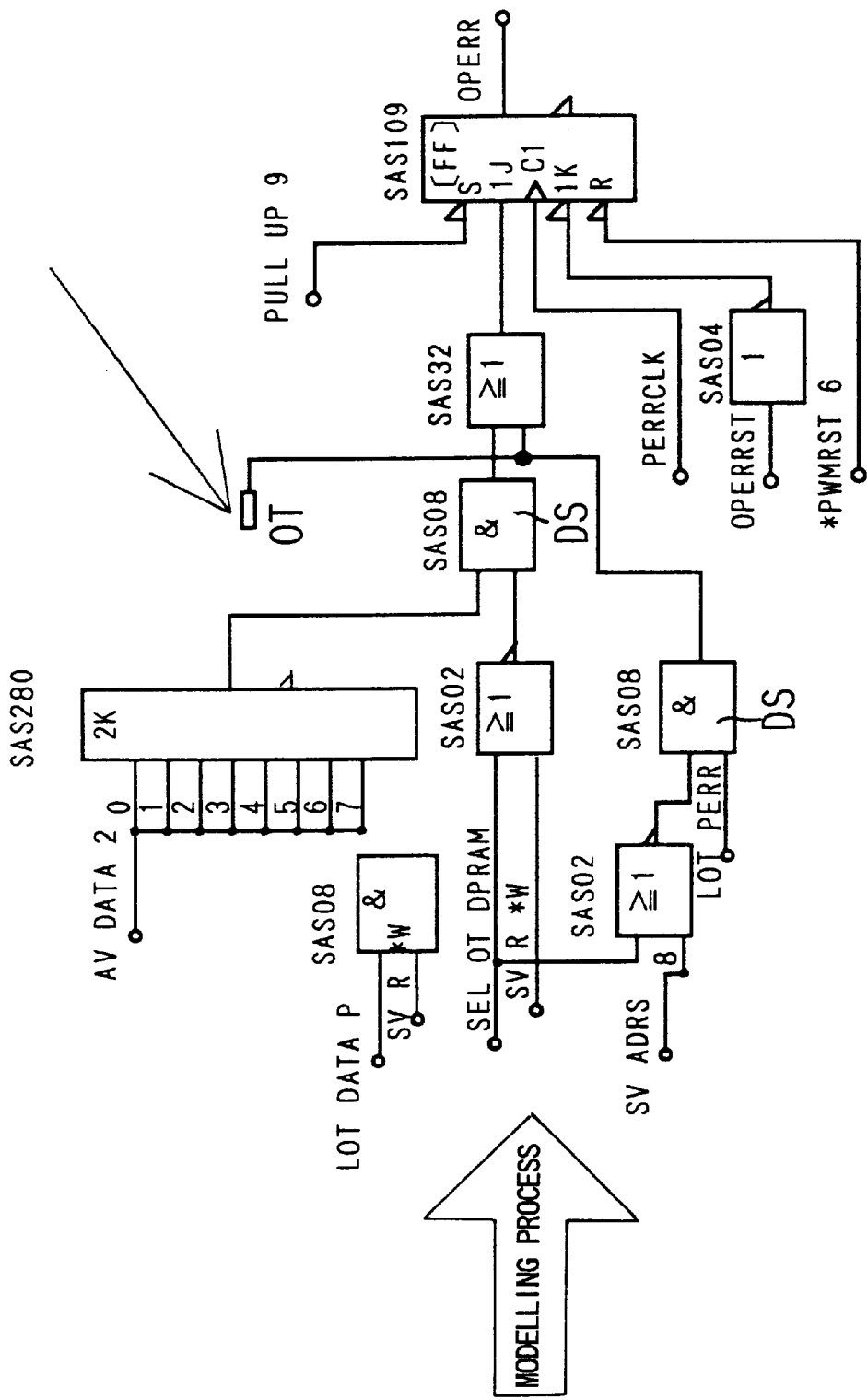
FIG. 45 is a circuit diagram showing a concrete example after the outside terminal is added thereto in the method and apparatus for circuit conversion for simulation according to the present invention.

Also, in the circuit model building means 24, as shown in FIGS. 44, 45, an outside terminal OT is added to a specified place by specifying an instruction for extending the symbol pin in the digital circuit symbol DS to the outside terminal OT in circuit conversion. With this feature, a state value of a particular terminal can be controlled from the outside, so that simulation in a desired state can be performed.

Figure 46:
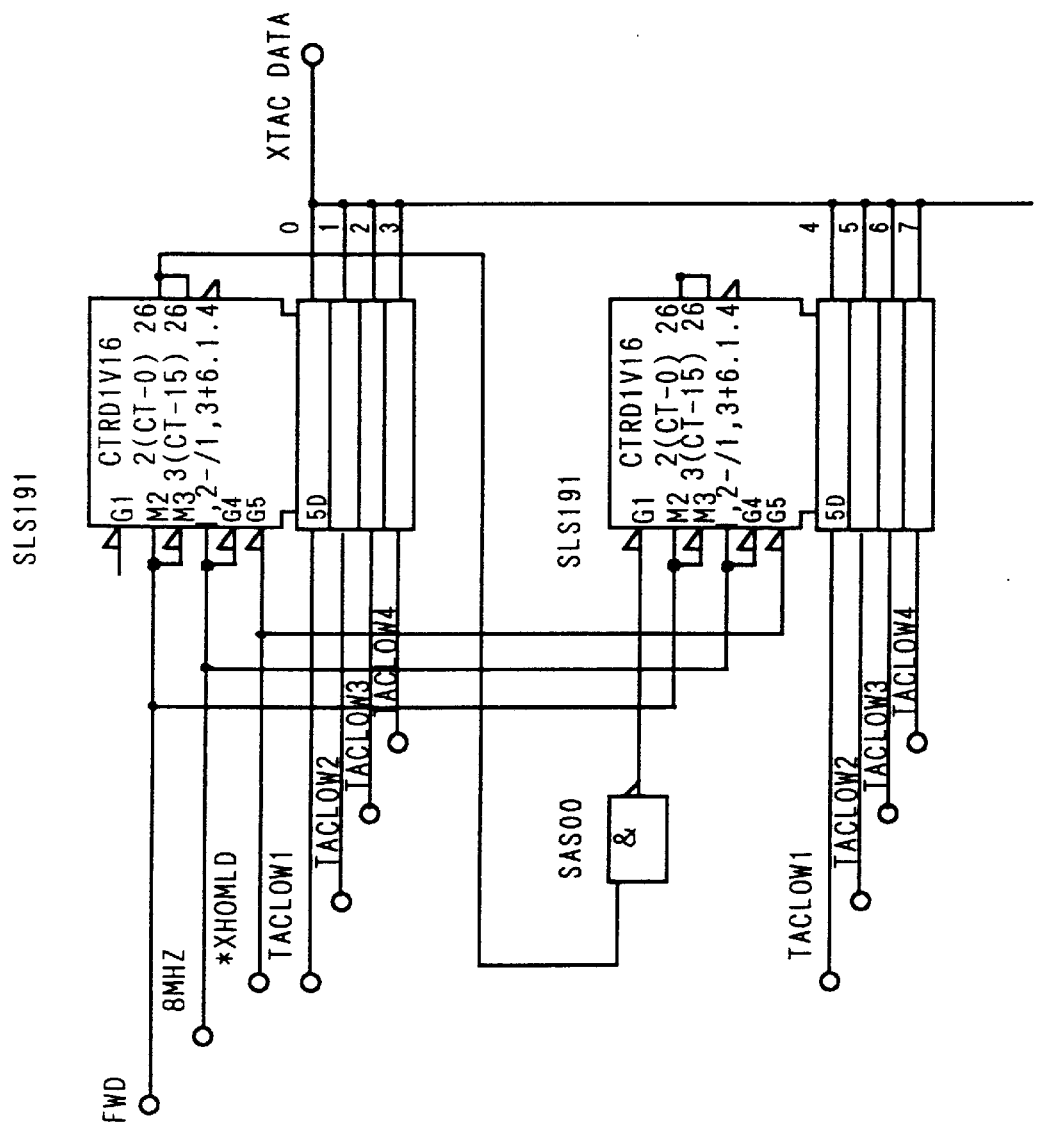
FIG. 46 is a circuit diagram showing a concrete example before the data is modelled according to specification of a unique name in the method and apparatus for circuit conversion for simulation according to the present invention.
Figure 47:
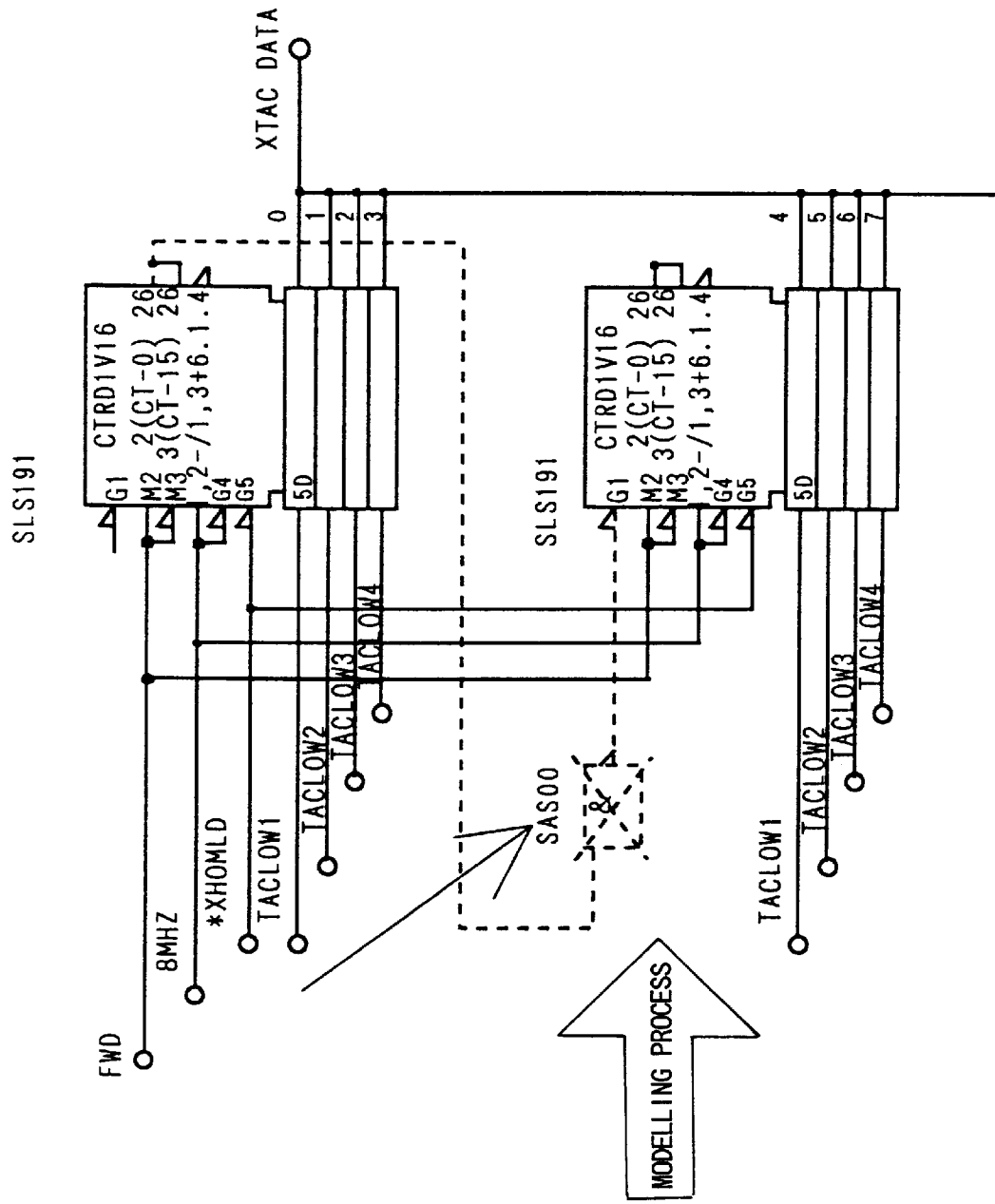
FIG. 47 is a circuit diagram showing a concrete example after the data is modelled according to specification of a unique name in the method and apparatus for circuit conversion for simulation according to the present invention.
Figure 48:
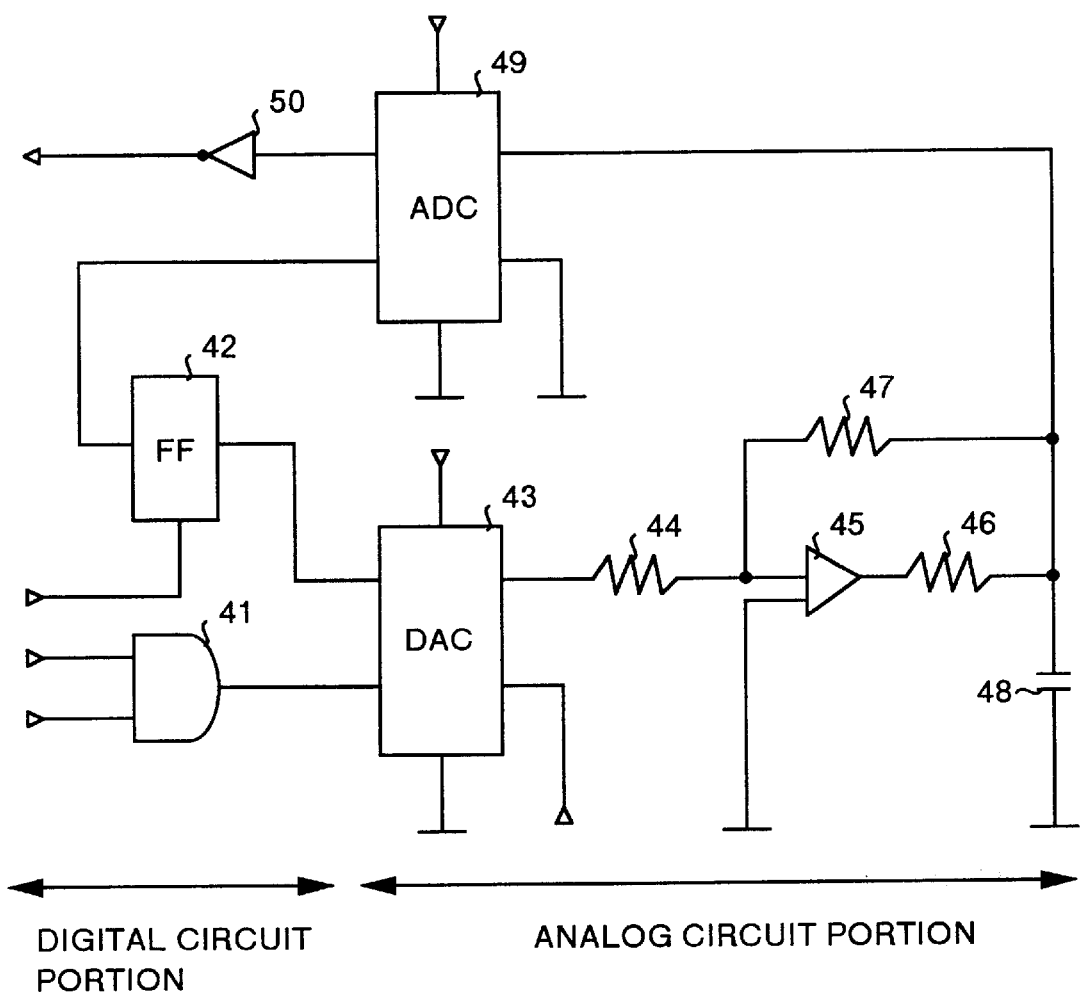
FIG. 48 is a circuit diagram showing one example of a digital/analog hybrid circuit.
Figure 49:
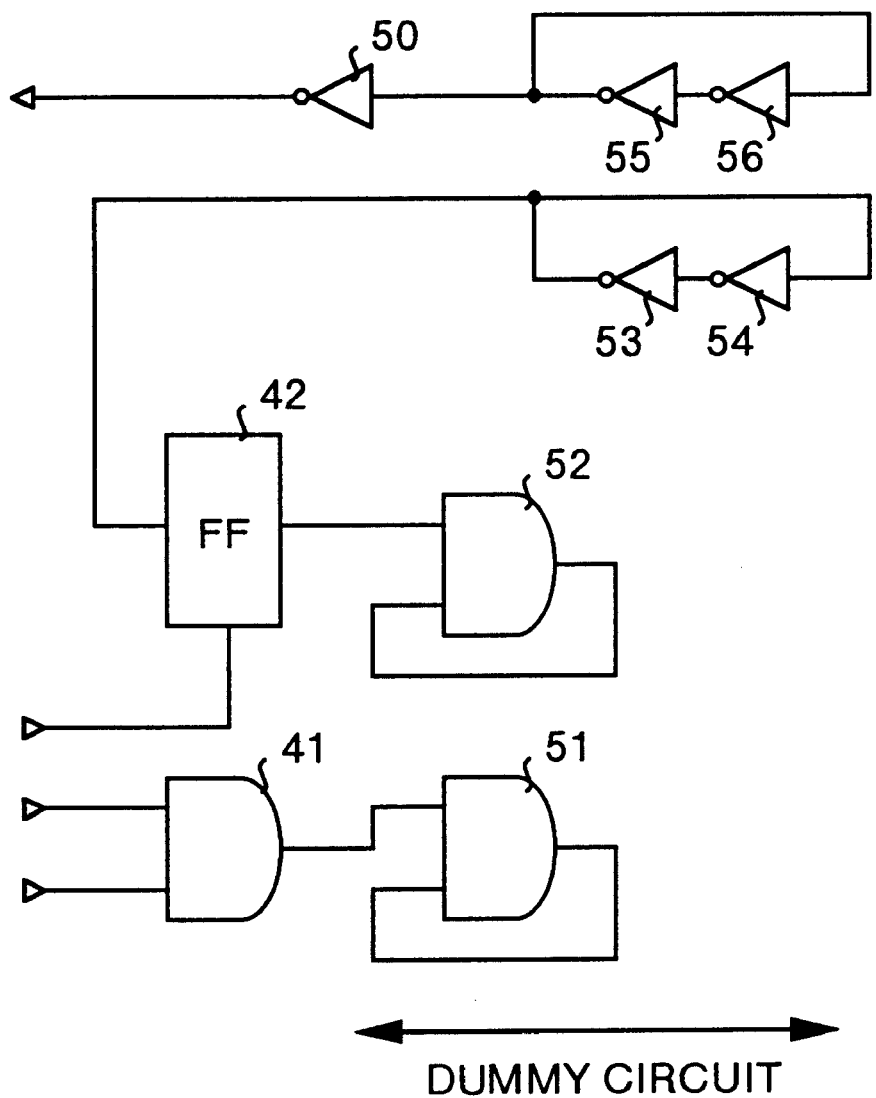
FIG. 49 is a circuit diagram showing one example in a case where the digital/analog hybrid circuit shown in FIG. 48 is rewritten to a circuit for digital simulation.
Figure 50:
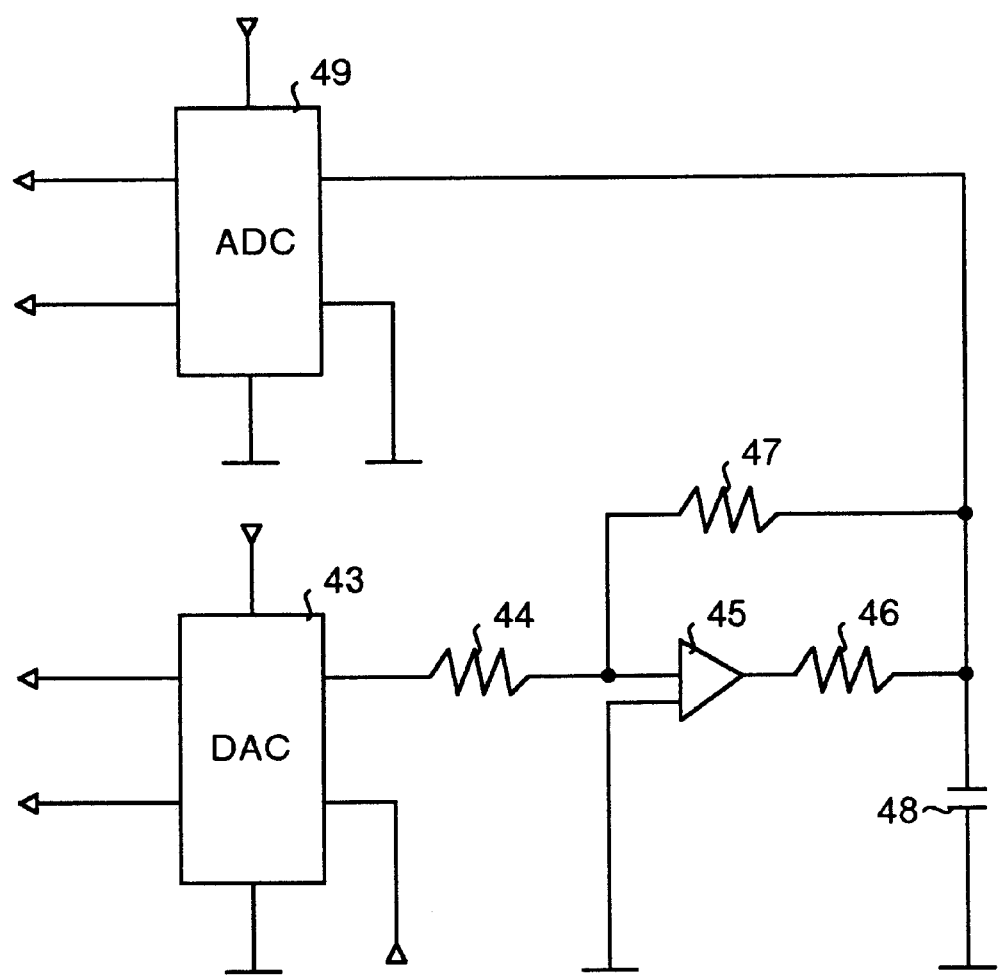
FIG. 50 is a circuit diagram showing one example in a case where the digital/analog hybrid circuit shown in FIG. 48 is rewritten to a circuit for analog simulation.

In the circuit model building means 24, in addition to the process for automatic conversion of data as a single unit according to the conversion rules, as shown in FIGS. 46, 47, the user can also specify a unique name "SAS00" for a symbol to delete it discretely.

As described above, as for a digital portion modelled by the method and apparatus for circuit conversion for simulation for the digital/analog hybrid circuit according to the present invention, simulation for the digital circuit portion is executed as it is by the digital simulator, and a result of the simulation can be obtained thereby.

Data for an analog portion in the digital/analog hybrid circuit is generally rewritten to a circuit for analog simulation to input it to the analog simulator dedicated to an analog circuit. Then, the simulation for the analog circuit portion is executed according to the analog simulator and a result of the simulation can be obtained thereby.

The digital circuit portion and the analog circuit portion in the digital/analog hybrid circuit are discretely evaluated based on the results of the simulation obtained from the simulators respectively, and the various evaluations performed on the digital/analog hybrid circuit as an object for simulation are totally determined based on each evaluation on the digital circuit portion as well as on the analog circuit portion.

As understood from the description above, with the circuit conversion method for simulation according to the present invention, data on a digital/analog hybrid circuit is converted to a circuit model suited for digital simulation according to the conversion rules by separating the digital circuit portion from the analog circuit portion therein, so that the modelling process can automatically be executed and the best process performance of digital simulation can be obtained thereby.

With the circuit conversion method for simulation according to the present invention, a digital/analog hybrid circuit is converted to a circuit model suited for digital simulation according to the conversion rules, so that the modelling process can automatically be executed and the best process performance of digital simulation can be obtained thereby. As a result, efficiency of analysis is dramatically improved, operation efficiency of simulation as well as of logic change which are repeatedly executed in the developing stage of the data processing apparatus is improved, and efficiency of logic design is also improved.

With the circuit conversion method for simulation according to the present invention, a resistance circuit based on connection to an input pin in a digital circuit symbol as well as to a power source net or a ground net is modelled as a digital constant value, so that, even if a resistance circuit based on connection to an input pin in a digital circuit symbol as well as to a power source net or a ground net exists in a digital/analog hybrid circuit, a modelled circuit suited for digital simulation can be obtained.

With the circuit conversion method for simulation according to the present invention, an analog symbol for a resistor, a by-pass capacitor in a power source, a transistor, a diode, a crystal oscillator, a speaker, a switch, an analog circuit such as an operating amplifier, a delay circuit, and a filter circuit are deleted, and a through gate or a delay control gate is inserted into the portions, or nets at both edges of the portion are open for modelling as a digital circuit, so that, even if an analog symbol for a resistor, a by-pass capacitor in a power source, a transistor, a diode, a crystal oscillator, a speaker, a switch, an analog circuit such as an operating amplifier, a delay circuit, and a filter circuit exist in a digital/analog hybrid circuit, a modelled circuit suited for digital simulation can be obtained.

With the circuit conversion method for simulation according to the present invention, an analog symbol for a resistor based on open collector dot connection is replaced with an AND logic gate, so that, even if an analog symbol for a resistor based on open collector dot connection exists in a digital/analog hybrid circuit, a modelled circuit suited for digital simulation can be obtained.

With the circuit conversion method for simulation according to the present invention, conversion to a digital model is executed by deleting a power circuit and a ground net, so that, even if a power circuit and a ground net exist in a digital/analog hybrid circuit, a modelled circuit suited for digital simulation can be obtained.

With the circuit conversion method for simulation according to the present invention, signal input/output attributes for digital circuit symbols and signal input/output attributes for an outside terminal are optimized according to a modelled circuit. Hence, even if contradiction occurs between signal input/output attributes for signals for digital circuit symbols and signal input/output attributes for signals for an outside terminal, the attributes are optimized. For this reason, a modelled circuit suited for digital simulation can be obtained.

With the circuit conversion method for simulation according to the present invention, even if a signal flow is interrupted in a modelled circuit, transaction of signals from the outside can be executed by generating an outside terminal, so that a modelled circuit suited for digital simulation can be obtained.

With the circuit conversion method for simulation according to the present invention, a digitally not-required outside terminal and a functionally floating circuit in the modelling process are automatically deleted, so that a modelled circuit without a not-required portion therein suited for digital simulation can be obtained.

With the circuit conversion method for simulation according to the present invention, an outside terminal is connected to a specified place by specifying external connection in circuit conversion, so that control for simulation can be executed, and for this reason the simulation can be executed in a desired state.

With the circuit conversion method for simulation according to the present invention, modelling such as deletion and setting of a constant can arbitrarily be executed for each symbol by discretely specifying a unique name for the symbol in circuit data other than in-batch automatic conversion of symbols as a single unit according to a conversion rule, so that a modelled circuit desired by a user and suited for digital simulation can be obtained.

With the simulator according to the present invention, simulation is executed to the converted circuit model data using each of the circuit conversion methods for simulation, so that the best process performance of the digital simulator can be obtained.

With the circuit converting apparatus for simulation according to the present invention, a digital/analog hybrid circuit is converted to a circuit model suited for digital simulation according to the conversion rules by separating the digital circuit portion from the analog circuit portion therein, so that the modelling process can automatically be executed and the best process performance of digital simulation can be obtained thereby.

With the circuit converting apparatus for simulation according to the present invention, a digital/analog hybrid circuit is automatically converted to a circuit model suited for digital simulation according to the conversion rules, so that a modelled circuit suited for digital simulation can be obtained without requiring a complicated manual operation for rewriting a circuit and the best process performance of the digital simulation can be obtained thereby. As a result, efficiency of analysis is dramatically improved, operation efficiency of simulation as well as of logic change which are repeatedly executed in the developing stage of the data processing apparatus is improved, and efficiency of logic design is also improved.

With the simulator according to the present invention, simulation is executed to the converted circuit model data using each of the circuit converting apparatuses for simulation, so that the best process performance of the digital simulator can be obtained.

With the computer-readable medium having stored thereon a program according to the present invention, a digital/analog hybrid circuit is converted to a circuit model suited for digital simulation according to the conversion rules, so that the modelling process can automatically be executed and the best process performance of the digital simulation can be obtained thereby. As a result, efficiency of analysis is dramatically improved, operation efficiency of simulation as well as of logic change which are repeatedly executed in the developing stage of the data processing apparatus is improved, and efficiency of logic design is also improved.

With the computer-readable medium having stored thereon a program therefor according to the present invention, a resistance circuit based on connection to an input pin in a digital circuit symbol as well as to a power source net or a ground net is modelled as a digital constant value. Hence, even if a resistance circuit based on connection to an input pin in a digital circuit symbol as well as to a power source net or a ground net exists in a digital/analog hybrid circuit, a modelled circuit suited for digital simulation can be obtained.

With the computer-readable medium having stored thereon a program according to the present invention, an analog symbol for resistance, a by-pass capacitor in a power source, a transistor, a diode, a crystal oscillator, a speaker, a switch, an analog circuit such as an operating amplifier, a delay circuit, and a filter circuit are deleted, and a through gate or a delay control gate is inserted into the portions, or nets at both edges of the portion are opened for modelling as a digital circuit. Thus, even if an analog symbol for resistance, a by-pass capacitor in a power source, a transistor, a diode, a crystal oscillator, a speaker, a switch, an analog circuit such as an operating amplifier, a delay circuit, and a filter circuit exist in a digital/analog hybrid circuit, a modelled circuit suited for digital simulation can be obtained.

With the computer-readable medium with a program therefor stored therein according to the present invention, an analog symbol for resistance based on open collector dot connection is replaced with an AND logic gate. In this manner, even if an analog symbol for resistance based on open collector dot connection exists in a digital/analog hybrid circuit, a modelled circuit suited for digital simulation can be obtained.

With the computer-readable medium having stored thereon a program therefor according to the present invention, conversion to a digital model is executed by deleting a power circuit and a ground net. Even if a power circuit and a ground net exist in a digital/analog hybrid circuit, a modelled circuit suited for digital simulation can thus be obtained.

With the computer-readable medium having stored thereon a program therefor according to the present invention, signal input/output attributes for digital circuit symbols and signal input/output attributes for an outside terminal are optimized according to a modelled circuit. Hence, even if contradiction occurs between signal input/output attributes for digital circuit symbols and signal input/output attributes for an outside terminal, the attributes are optimized, and for this reason a modelled circuit suited for digital simulation can be obtained.

With the computer-readable medium having stored thereon a program therefor according to the present invention, even if a signal flow is interrupted in a modelled circuit, transaction of signals from the outside can be executed by generating an outside terminal, so that a modelled circuit suited for digital simulation can be obtained.

With the computer-readable medium having stored thereon a program therefor according to the present invention, a digitally not-required outside terminal and a functionally floating circuit in the modelling process are deleted automatically, so that a modelled circuit without any not-required portion therein suited for digital simulation can be obtained.

With the computer-readable medium having stored thereon a program therefor according to the present invention, an outside terminal is connected to a specified place by specifying external connection in circuit conversion, so that control in simulation can be executed, and for this reason simulation can be executed in a desired state.

With the computer-readable medium having stored thereon a program according to the present invention, modelling such as deletion and setting of a constant can arbitrarily be executed for each symbol by discretely specifying a unique name for the symbol in circuit data other than in-batch automatic conversion of symbols according to a conversion rule, so that a modelled circuit desired by a user suited for digital simulation can be obtained.

This application is based on Japanese patent application No. HEI 9-061235 filed in the Japanese Patent Office on Mar. 14, 1997, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A circuit conversion method for simulation for converting a digital/analog hybrid circuit to a digital simulation circuit, comprising the steps of:

classifying inputted circuit data for a digital/analog hybrid data to various types of data each corresponding to a type of circuit attribute;

specifying a conversion rule corresponding to a type of circuit data classified in said circuit data classifying step for each classified circuit data by collating the conversion rule to a circuit conversion rule table with conversion rules for each of the types classified in said circuit data classifying step stored therein; and converting circuit data classified in said circuit data classifying step according to the conversion rule specified in said conversion rule collating step for model conversion of said digital/analog hybrid circuit to a circuit suited for digital simulation, wherein as a conversion rule stored in said circuit conversion rule table, a conversion rule for deleting an analog symbol for a resistor, a by-pass capacitor in a power source, a transistor, a diode, a crystal oscillator, a speaker, a switch, an analog circuit such as an operating amplifier, a delay circuit, and a filter circuit, inserting a through gate or a delay control gate, or opening nets at both edges of the portions; wherein the analog symbol for a resistor, a by-pass capacitor in a power source; a transistor, a diode, a crystal oscillator, a speaker, a switch, an analog circuit such as an operating amplifier, a delay circuit, and a filter circuit are deleted, wherein a through gate or a delay control gate is inserted into the deleted portion, or nets at both edges of the potion are opened according to the corresponding conversion rule for modeling to a digital circuit according.

2. A circuit conversion method for simulation for converting a digital/analog hybrid circuit to a digital simulation circuit, comprising the steps of:

classifying inputted circuit data for a digital/analog hybrid data to various types of data each corresponding to a type of circuit attribute;

specifying a conversion rule corresponding to a type of circuit data classified in said circuit data classifying step for each classified circuit data by collating the conversion rule to a circuit conversion rule table with conversion rules for each of the types classified in said circuit data classifying step stored therein; and converting circuit data classified in said circuit data classifying step according to the conversion rule specified in said conversion rule collating step for model conversion of said digital/analog hybrid circuit to a circuit suited for digital simulation, wherein a conversion rule stored in said circuit conversion rule table, a conversion rule replacing an analog symbol for resistance based on open collector dot connection with an AND logic gate, wherein the analog symbol for resistance based on open collector dot connection is replaced with the AND logic circuit according to a corresponding conversion rule.

3. A circuit conversion method for simulation for converting a digital/analog hybrid circuit to a digital simulation circuit, comprising the steps of:

classifying inputted circuit data for a digital/analog hybrid data to various types of data each corresponding to a type of circuit attribute;

specifying a conversion rule corresponding to a type of circuit data classified in said circuit data classifying step for each classified circuit data by collating the conversion rule to a circuit conversion rule table with conversion rules for each of the types classified in said circuit data classifying step stored therein; and converting circuit data classified in said circuit data classifying step according to the conversion rule specified in said conversion rule collating step for model conversion of said digital/analog hybrid circuit to a circuit suited for digital simulation, wherein as a conversion rule stored in said circuit conversion rule table, a conversion rule searching a power source net and a ground net from power source symbols and ground symbols and deleting a power circuit and a ground net, wherein the power source net and ground net are searched from power symbols and ground symbols and also the power circuit and ground net are deleted for conversion to a digital model according to the appropriate conversion rule in said converting step.

4. A circuit conversion method for simulation for converting a digital/analog hybrid circuit to a digital simulation circuit, comprising the steps of:

classifying inputted circuit data for a digital/analog hybrid data to various types of data each corresponding to a type of circuit attribute;

specifying a conversion rule corresponding to a type of circuit data classified in said circuit data classifying step for each classified circuit data by collating the conversion rule to a circuit conversion rule table with conversion rules for each of the types classified in said circuit data classifying step stored therein; and converting circuit data classified in said circuit data classifying step according to the conversion rule specified in said conversion rule collating step for model conversion of said digital/analog hybrid circuit to a circuit suited for digital simulation, wherein as a conversion rule stored in said circuit conversion rule table, a conversion rule relating to attribute setting optimizing signal input/output attributes for digital circuit symbols and signal input/output attributes for an outside terminal according to a modelled circuit, wherein the signal input/output attributes for digital circuit symbols and also signal input/output attributes for an outside terminal are optimized according to the modelled circuit in said converting step.

5. A circuit conversion method for simulation for converting a digital/analog hybrid circuit to a digital simulation circuit, comprising the steps of:

classifying inputted circuit data for a digital/analog hybrid data to various types of data each corresponding to a type of circuit attribute;

specifying a conversion rule corresponding to a type of circuit data classified in said circuit data classifying step for each classified circuit data by collating the conversion rule to a circuit conversion rule table with conversion rules for each of the types classified in said circuit data classifying step stored therein; and converting circuit data classified in said circuit data classifying step according to the conversion rule specified in said conversion rule collating step for model conversion of said digital/analog hybrid circuit to a circuit suited for digital simulation, wherein as a conversion rule stored in said circuit conversion rule table, a conversion rule generating an outside terminal in a case when a signal flow is interrupted in the modelled circuit, wherein the outside terminal is generated according to a corresponding conversion rule in said converting step.

6. A circuit conversion method for simulation for converting a digital/analog hybrid circuit to a digital simulation circuit, comprising the steps of:

classifying inputted circuit data for a digital/analog hybrid data to various types of data each corresponding to a type of circuit attribute;

specifying a conversion rule corresponding to a type of circuit data classified in said circuit data classifying step for each classified circuit data by collating the conversion rule to a circuit conversion rule table with conversion rules for each of the types classified in said circuit data classifying step stored therein; and converting circuit data classified in said circuit data classifying step according to the conversion rule specified in said conversion rule collating step for model conversion of said digital/analog hybrid circuit to a circuit suited for digital simulation, wherein as a conversion rule stored in said circuit conversion rule table, a conversion rule automatically deleting an outside terminal digitally not required and a functionally floating circuit in the modelling process, wherein a digitally not-required outside terminal and a circuit functionally floating in the modelling process are automatically deleted according to a corresponding conversion rule in said converting step.

7. A circuit conversion method for simulation for converting a digital/analog hybrid circuit to a digital simulation circuit, comprising the steps of:

classifying inputted circuit data for a digital/analog hybrid data to various types of data each corresponding to a type of circuit attribute;

specifying a conversion rule corresponding to a type of circuit data classified in said circuit data classifying step for each classified circuit data by collating the conversion rule to a circuit conversion rule table with conversion rules for each of the types classified in said circuit data classifying step stored therein; and converting circuit data classified in said circuit data classifying step according to the conversion rule specified in said conversion rule collating step for model conversion of said digital/analog hybrid circuit to a circuit suited for digital simulation, wherein an outside terminal is connected to a specified place by specifying external connection in circuit conversion.

8. A simulator for simulation for converting a digital/analog hybrid circuit to a digital simulation circuit, comprising:

a classifying unit classifying inputted circuit data for a digital/analog hybrid data to various types of data each corresponding to a type of circuit attribute;

a specifying unit specifying a conversion rule corresponding to a type of circuit data classified by said classifying unit for each classified circuit data by collating the conversion rule to a circuit conversion rule table with conversion rules for each of the types classified by said classifying unit stored therein; and a converter converting circuit data classified by said classifying unit according to the conversion rule specified by said specifying unit for model conversion of said digital/analog hybrid circuit to a circuit suited for digital simulation, wherein as a conversion rule stored in said circuit conversion rule table, a conversion rule deleting an analog symbol for a resistor, a by-pass capacitor in a power source, a transistor, a diode, a crystal oscillator, a speaker, a switch, an analog circuit such as an operating amplifier, a delay circuit, and a filter circuit, inserting a through gate or a delay control gate, or opening nets at both edges of the portions, wherein the analog symbol for a resistor, a by-pass capacitor in a power source, a transistor, a diode, a crystal oscillator, a speaker, a switch, an analog circuit such as an operating amplifier, a delay circuit, and a filter circuit are deleted, and a through gate or a delay control gate is inserted into the deleted portion, or nets at both edges of the portion are opened according to the corresponding conversion rule for modeling to a digital circuit.

9. A simulator, simulating the conversion of a digital/analog hybrid circuit to a digital simulation circuit, comprising:

a classifying unit classifying inputted circuit data for a digital/analog hybrid data to various types of data each corresponding to a type of circuit attribute;

a specifying unit specifying a conversion rule corresponding to a type of circuit data classified by said classifying unit for each classified circuit data by collating the conversion rule to a circuit conversion rule table with conversion rules for each of the types classified by said classifying unit stored therein; and a converter converting circuit data classified by said classifying unit according to the conversion rule specified by said specifying unit for model conversion of said digital/analog hybrid circuit to a circuit suited for digital simulation, wherein a conversion rule stored in said circuit conversion rule table, a conversion rule replacing an analog symbol for resistance based on open collector dot connection with an AND logic gate, wherein the analog symbol for resistance based on open collector dot connection is replaced with the AND logic circuit according to a corresponding conversion rule.

10. A simulator, simulating the conversion of a digital/analog hybrid circuit to a digital simulation circuit, comprising:

a classifying unit classifying inputted circuit data for a digital/analog hybrid data to various types of data each corresponding to a type of circuit attribute;

a specifying unit specifying a conversion rule corresponding to a type of circuit data classified by said classifying unit for each classified circuit data by collating the conversion rule to a circuit conversion rule table with conversion rules for each of the types classified by said classifying unit stored therein; and a converter converting circuit data classified by said classifying unit according to the conversion rule specified by said specifying unit for model conversion of said digital/analog hybrid circuit to a circuit suited for digital simulation, wherein as a conversion rule stored in said circuit conversion rule table, a conversion rule searching a power source net and a ground net from power source symbols and ground symbols and deleting a power circuit and a ground net, wherein the power source net and ground net are searched from power symbols and ground symbols and also the power circuit and ground net are deleted for conversion to a digital model according to the corresponding conversion rule in said converter.

11. A simulator, simulating the conversion of a digital/analog hybrid circuit to a digital simulation circuit, comprising:

a classifying unit classifying inputted circuit data for a digital/analog hybrid data to various types of data each corresponding to a type of circuit attribute;

a specifying unit specifying a conversion rule corresponding to a type of circuit data classified by said classifying unit for each classified circuit data by collating the conversion rule to a circuit conversion rule table with conversion rules for each of the types classified by said classifying unit stored therein; and a converter converting circuit data classified by said classifying unit according to the conversion rule specified by said specifying unit for model conversion of said digital/analog hybrid circuit to a circuit suited for digital simulation, wherein as a conversion rule stored in said circuit conversion rule table, a conversion rule relating to attribute setting optimizing signal input/output attributes for digital circuit symbols and signal input/output attributes for an outside terminal according to a modelled circuit, wherein the signal input/output attributes for digital circuit symbols and also signal input/output attributes for an outside terminal are optimized according to the modelled circuit in said converter.

12. A simulator, simulating the conversion of a digital/analog hybrid circuit to a digital simulation circuit, comprising:

a classifying unit classifying inputted circuit data for a digital/analog hybrid data to various types of data each corresponding to a type of circuit attribute;

a specifying unit specifying a conversion rule corresponding to a type of circuit data classified by said classifying unit for each classified circuit data by collating the conversion rule to a circuit conversion rule table with conversion rules for each of the types classified by said classifying unit stored therein; and a converter converting circuit data classified by said classifying unit according to the conversion rule specified by said specifying unit for model conversion of said digital/analog hybrid circuit to a circuit suited for digital simulation, wherein as a conversion rule stored in said circuit conversion rule table, a conversion rule generating an outside terminal in a case when a signal flow is interrupted in the modelled circuit, wherein the outside terminal is generated according to a corresponding conversion rule in said converter.

13. A simulator, simulating the conversion of a digital/analog hybrid circuit to a digital simulation circuit, comprising a classifying unit classifying inputted circuit data for a digital/analog hybrid data to various types of data each corresponding to a type of circuit attribute;

a specifying unit specifying a conversion rule corresponding to a type of circuit data classified by said classifying unit for each classified circuit data by collating the conversion rule to a circuit conversion rule table with conversion rules for each of the types classified by said classifying unit stored therein; and a converter converting circuit data classified by said classifying unit according to the conversion rule specified by said specifying unit for model conversion of said digital/analog hybrid circuit to a circuit suited for digital simulation, wherein as a conversion rule stored in said circuit conversion rule table, a conversion rule automatically deleting an outside terminal digitally not required and a functionally floating circuit in the modelling process, wherein a digitally not-required outside terminal and a circuit functionally floating in the modelling process are automatically deleted according to a corresponding conversion rule in said converter.

14. A simulator, simulating the conversion of a digital/analog hybrid circuit to a digital simulation circuit, comprising:

a classifying unit classifying inputted circuit data for a digital/analog hybrid data to various types of data each corresponding to a type of circuit attribute;

a specifying unit specifying a conversion rule corresponding to a type of circuit data classified by said classifying unit for each classified circuit data by collating the conversion rule to a circuit conversion rule table with conversion rules for each of the types classified by said classifying unit stored therein; and a converter converting circuit data classified by said classifying unit according to the conversion rule specified by said specifying unit for model conversion of said digital/analog hybrid circuit to a circuit suited for digital simulation, wherein an outside terminal is connected to a specified place by specifying external connection in circuit conversion.

15. A computer-readable medium having stored thereon a program causing a computer to perform conversion of a digital/analog hybrid circuit to a circuit for digital simulation comprising the following sequences:

a circuit data classification sequence in which inputted circuit data for a digital/analog circuit is classified according to types of circuit attributes;

a conversion rule collation sequence in which conversion rules corresponding to types of circuit data classified in said circuit data classification sequence are specified for each type of classified circuit data by collating the conversion rule to a circuit conversion rule table in which conversion rules set for each type of circuit data classified in said circuit data classification sequence have been stored; and a circuit model building sequence in which the circuit data classified in said circuit data classification sequence is converted according to the conversion rule specified in said conversion rule collation sequence to convert said digital/analog hybrid circuit to a circuit suited for digital simulation, wherein as a conversion rule stored in said circuit conversion rule table, deleting an analog symbol for a resistor, a bypass capacitor for a power source, a transistor, a diode, a crystal oscillator, a speaker, a switch, an analog circuit such as an operating amplifier, a delay circuit, and a filter circuit, and also inserting a through gate, a delay control gate, or opening nets at both edges of the section, wherein an analog symbol for a resistor, a bypass capacitor for a power source, a transistor, a crystal oscillator, a speaker, a switch, an analog circuit such as an operating amplifier, a delay circuit, and a filter circuit are deleted, a through gate or a delay control gate is inserted into the portion, or nets at both edges of the portion are opened according to the corresponding conversion rule in said circuit model building sequence for modelling to a digital circuit.

16. A computer-readable medium having stored thereon a program causing a computer to perform conversion of a digital/analog hybrid circuit to a circuit for digital simulation comprising the following sequences:

a circuit data classification sequence in which inputted circuit data for a digital/analog circuit is classified according to types of circuit attributes;

a conversion rule collation sequence in which conversion rules corresponding to types of circuit data classified in said circuit data classification sequence are specified for each type of classified circuit data by collating the conversion rule to a circuit conversion rule table in which conversion rules set for each type of circuit data classified in said circuit data classification sequence have been stored; and a circuit model building sequence in which the circuit data classified in said circuit data classification sequence is converted according to the conversion rule specified in said conversion rule collation sequence to convert said digital/analog hybrid circuit to a circuit suited for digital simulation, wherein as a conversion rule stored in said circuit conversion rule table, a conversion rule replacing an analog symbol for a resistor based on open collector dot connection with an AND logic gate, wherein the analog symbol for resistance based on an open collector dot connection is replaced with an AND logic gate according to the corresponding conversion rule in said circuit model building sequence.

17. A computer-readable medium having stored thereon a program causing a computer to perform conversion of a digital/analog hybrid circuit to a circuit for digital simulation comprising the following sequences:

a circuit data classification sequence in which inputted circuit data for a digital/analog circuit is classified according to types of circuit attributes;

a conversion rule collation sequence in which conversion rules corresponding to types of circuit data classified in said circuit data classification sequence are specified for each type of classified circuit data by collating the conversion rule to a circuit conversion rule table in which conversion rules set for each type of circuit data classified in said circuit data classification sequence have been stored; and a circuit model building sequence in which the circuit data classified in said circuit data classification sequence is converted according to the conversion rule specified in said conversion rule collation sequence to convert said digital/analog hybrid circuit to a circuit suited for digital simulation, wherein as a conversion rule stored in said circuit conversion rule table, a conversion rule searching a power source net and a ground net from power symbols and ground symbols respectively and deleting a power circuit and a ground net, wherein a power source net and a ground net are searched from power symbols and ground symbols, the power circuit and ground net are deleted for model conversion to a digital circuit according to the corresponding conversion rule in said circuit model building sequence.

18. A computer-readable medium having stored thereon a program causing a computer to perform conversion of a digital/analog hybrid circuit to a circuit for digital simulation comprising the following sequences:

a circuit data classification sequence in which inputted circuit data for a digital/analog circuit is classified according to types of circuit attributes;

a conversion rule collation sequence in which conversion rules corresponding to types of circuit data classified in said circuit data classification sequence are specified for each type of classified circuit data by collating the conversion rule to a circuit conversion rule table in which conversion rules set for each type of circuit data classified in said circuit data classification sequence have been stored; and a circuit model building sequence in which the circuit data classified in said circuit data classification sequence is converted according to the conversion rule specified in said conversion rule collation sequence to convert said digital/analog hybrid circuit to a circuit suited for digital simulation, wherein as a conversion rule stored in said circuit conversion rule table, a conversion rule relating to setting attributes optimizing signal input/output attributes for digital circuit symbols and also signal input/output attributes for outside terminals according to a modelled circuit, wherein signal input/output attributes for digital circuit symbols and signal input/output attributes for outside terminals are optimized according to the modelled circuit according to the corresponding conversion rule in said circuit model building sequence.

19. A computer-readable medium having stored thereon a program causing a computer to perform conversion of a digital/analog hybrid circuit to a circuit for digital simulation comprising the following sequences:

a circuit data classification sequence in which inputted circuit data for a digital/analog circuit is classified according to types of circuit attributes;

a conversion rule collation sequence in which conversion rules corresponding to types of circuit data classified in said circuit data classification sequence are specified for each type of classified circuit data by collating the conversion rule to a circuit conversion rule table in which conversion rules set for each type of circuit data classified in said circuit data classification sequence have been stored; and a circuit model building sequence in which the circuit data classified in said circuit data classification sequence is converted according to the conversion rule specified in said conversion rule collation sequence to convert said digital/analog hybrid circuit to a circuit suited for digital simulation, wherein as a conversion rule stored in said circuit conversion rule table, a conversion rule generating an outside terminal in a case where a signal flow is interrupted in a modelled circuit, wherein an outside terminal is generated according to the corresponding conversion rule in said circuit model building sequence.

20. A computer-readable medium having stored thereon a program causing a computer to perform conversion of a digital/analog hybrid circuit to a circuit for digital simulation comprising the following sequences:

a circuit data classification sequence in which inputted circuit data for a digital/analog circuit is classified according to types of circuit attributes;

a conversion rule collation sequence in which conversion rules corresponding to types of circuit data classified in said circuit data classification sequence are specified for each type of classified circuit data by collating the conversion rule to a circuit conversion rule table in which conversion rules set for each type of circuit data classified in said circuit data classification sequence have been stored; and a circuit model building sequence in which the circuit data classified in said circuit data classification sequence is converted according to the conversion rule specified in said conversion rule collation sequence to convert said digital/analog hybrid circuit to a circuit suited for digital simulation; wherein as a conversion rule stored in said circuit conversion rule table, a conversion rule automatically deleting an outside terminal digitally not required and a functionally floating circuit in the modelling process, wherein the outside terminal digitally not required and the circuit functionally floating in the modelling process are automatically deleted according to the corresponding conversion rule in said circuit model building sequence.

21. A computer-readable medium having stored thereon a program causing a computer to perform conversion of a digital/analog hybrid circuit to a circuit for digital simulation comprising the following sequences:

a circuit data classification sequence in which inputted circuit data for a digital/analog circuit is classified according to types of circuit attributes;

a conversion rule collation sequence in which conversion rules corresponding to types of circuit data classified in said circuit data classification sequence are specified for each type of classified circuit data by collating the conversion rule to a circuit conversion rule table in which conversion rules set for each type of circuit data classified in said circuit data classification sequence have been stored; and a circuit model building sequence in which the circuit data classified in said circuit data classification sequence is converted according to the conversion rule specified in said conversion rule collation sequence to convert said digital/analog hybrid circuit to a circuit suited for digital simulation, wherein under program control an outside terminal is connected to a place specified by instructing an external connection upon circuit conversion.

22. A circuit conversion method for simulation of a digital/analog hybrid circuit conversion to a digital simulation circuit, comprising the steps of:

specifying a conversion rule corresponding to a classified type of circuit data for each of a plurality of classified circuit data by collating the conversion rule to a circuit conversion rule table with conversion rules for each of the plurality of classified data stored therein; and converting the circuit data classified in said circuit data classifying step according to the specified conversion rule for model conversion of said digital/analog hybrid circuit to a circuit suited for digital simulation, wherein a conversion rule is provided for deleting analog symbols and inserting one of a through gate and a delay control gate into the deleted portion.

23. A circuit conversion method for simulation of a digital/analog hybrid circuit conversion to a digital simulation circuit, comprising the steps of:

specifying a conversion rule corresponding to a classified type of circuit data for each of a plurality of classified circuit data by collating the conversion rule to a circuit conversion rule table with conversion rules for each of the plurality of classified data stored therein; and converting the circuit data classified in said circuit data classifying step according to the specified conversion rule for model conversion of said digital/analog hybrid circuit to a circuit suited for digital simulation, wherein a conversion rule is provided for deleting analog symbols and inserting nets at both edges of the deleted potion, the nets being opened according to the corresponding conversion rule for modeling to a digital circuit.

* * * * *